United States Patent
Zhao et al.

(10) Patent No.: US 11,183,215 B1
(45) Date of Patent: Nov. 23, 2021

(54) THIN-FILM CRYSTALLINE STRUCTURE WITH SURFACES HAVING SELECTED PLANE ORIENTATIONS

(71) Applicant: Seagate Technology LLC, Cupertino, CA (US)

(72) Inventors: Tong Zhao, Eden Prairie, MN (US); Li Wan, Eden Prairie, MN (US); Michael Christopher Kautzky, Eagan, MN (US)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 16/524,551

(22) Filed: Jul. 29, 2019

Related U.S. Application Data

(63) Continuation-in-part of application No. 16/196,228, filed on Nov. 20, 2018, now abandoned.

(60) Provisional application No. 62/588,669, filed on Nov. 20, 2017.

(51) Int. Cl.

| | |
|---|---|
| *G11B 5/31* | (2006.01) |
| *G11B 5/73* | (2006.01) |
| *H01F 10/30* | (2006.01) |
| *G11B 5/66* | (2006.01) |
| *B32B 7/022* | (2019.01) |
| *B82B 1/00* | (2006.01) |
| *B82Y 10/00* | (2011.01) |

(52) U.S. Cl.
CPC ............. *G11B 5/739* (2019.05); *B32B 7/022* (2019.01); *B82B 1/003* (2013.01); *G11B 5/3133* (2013.01); *G11B 5/66* (2013.01); *H01F 10/30* (2013.01); *B82Y 10/00* (2013.01)

(58) Field of Classification Search
None
See application file for complete search history.

(56) References Cited

U.S. PATENT DOCUMENTS

| | | | |
|---|---|---|---|
| 6,248,416 B1 | 6/2001 | Lambeth et al. | |
| 7,128,988 B2 | 10/2006 | Lambeth | |
| 9,502,070 B2 | 11/2016 | Cheng et al. | |
| 9,822,444 B2* | 11/2017 | Zhao | G11B 5/314 |
| 2010/0019255 A1* | 1/2010 | Karino | H01S 5/227 |
| | | | 257/94 |
| 2014/0376349 A1* | 12/2014 | Cheng | G11B 5/85 |
| | | | 369/13.33 |

* cited by examiner

*Primary Examiner* — Kevin M Bernatz
(74) *Attorney, Agent, or Firm* — Mueting Raasch Group

(57) ABSTRACT

A thin film structure (e.g., a near-field transducer), includes a first surface parallel to a substrate on which the thin film structure is deposited and two other surfaces orthogonal to the first surface. The first surface and the two other surfaces have respective first, second, and third selected plane orientations with respective first, second, and third atomic packing factors. The first, second, and third selected plane orientations are selected to maximize an average of the first, second, and third atomic packing factors.

19 Claims, 34 Drawing Sheets

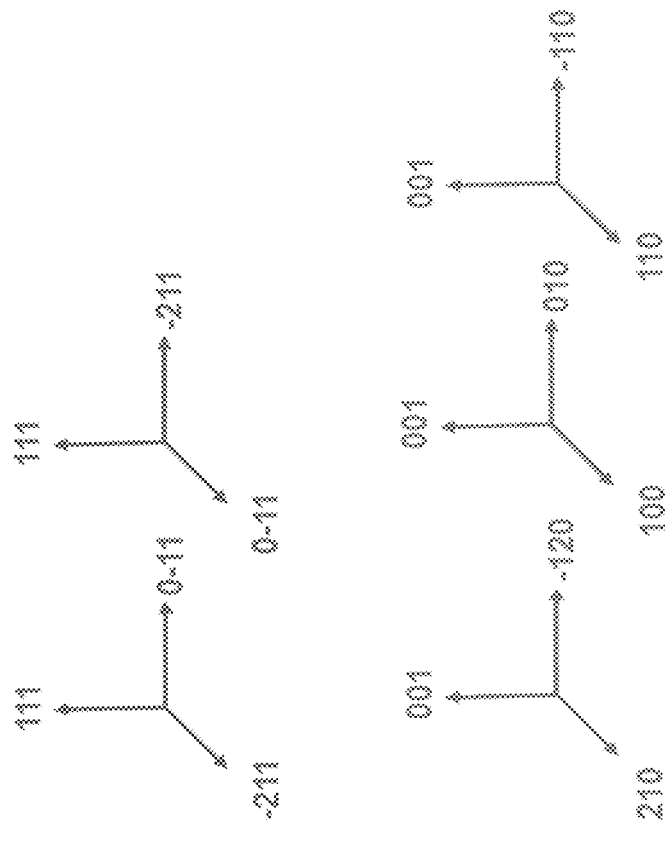
FIG. 6
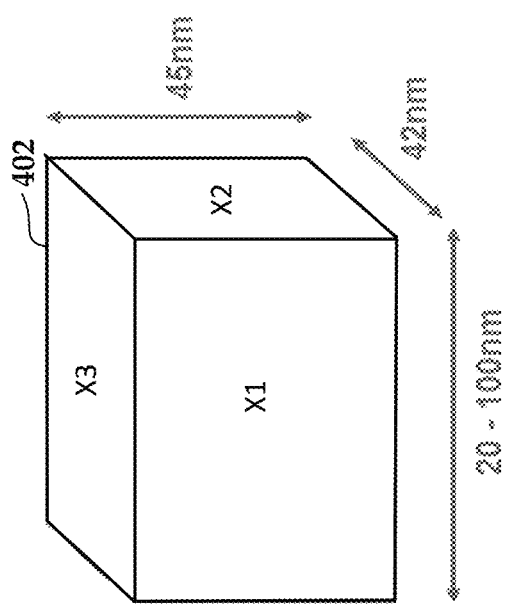
X1, X2, and X3 are surface areas of ABS, DT (growth), and CT (side) respectively

| Side | ABS | Growth | Averaged APF | | | Min APF | Max APF | Comment |
|---|---|---|---|---|---|---|---|---|
| X3 | X1 | X2 | peg BP = 20nm | peg BP = 50nm | peg BP = 100nm | | | |
| Growth Direction 100 | | | | | | | | |
| 100 | 010 | 001 | 0.7854 | 0.7854 | 0.7854 | 0.7854 | 0.7854 | Highest in Averaged and Min APF |
| -101 | 101 | 001 | 0.6262 | 0.6474 | 0.6576 | 0.5554 | 0.7854 | |
| 210 | -120 | 001 | 0.7727 | 0.7744 | 0.7752 | 0.767 | 0.7854 | |
| Growth Direction 111 | | | | | | | | |
| -211 | 0-11 | 111 | 0.7080 | 0.7538 | 0.7759 | 0.5554 | 0.9069 | Min APF at ABS |
| 0-11 | -211 | 111 | 0.7192 | 0.7249 | 0.7277 | 0.5554 | 0.9069 | Min APF at Side |
| ABS Direction -111 | | | | | | | | |
| 0-11 | 111 | -211 | 0.7351 | 0.6835 | 0.6587 | 0.5554 | 0.9069 | |
| -211 | 111 | 0-11 | 0.7351 | 0.6835 | 0.6587 | 0.5554 | 0.9069 | |
| Side Direction -111 | | | | | | | | |
| 111 | -211 | 0-11 | 0.7192 | 0.7249 | 0.7277 | 0.5554 | 0.9069 | |
| 111 | 0-11 | -211 | 0.7080 | 0.7538 | 0.7759 | 0.5554 | 0.9069 | |

FIG. 7

| | (111) ω FWHM(°) | In-Plane Alignment | TC (W/mK) |
|---|---|---|---|
| Control | 13.5 | No | 41 |
| Ar - 0° | 8.4 | No | 52 |
| Ar - 35.3° 1x | 14.0 | No | 45 |
| Ar - 35.3° 3x | 4.4 | Yes | 62 |

| | (111) ω FWHM(°) | In-Plane Alignment | TC (W/mK) |
|---|---|---|---|
| Control | 17.8 | No | 35 |
| Ar - 0° | 6.5 | No | 45 |
| Ar - 35.3° 1x | --- | 40 | 45 |
| Ar - 35.3° 3x | 4.2 | Yes | 50 |

| | Gas Species | (111) ω FWHM(°) | In-Plane Alignment | TC (W/mK) |
|---|---|---|---|---|
| Control, hot dep Rh(45 nm), no treatment | Ar | 12.5 | No | 69 |
| [Rh(4.2nm)/Ne(-3.8nm)]X5 + Rh(40nm) | Ne | 3.5 | Yes | 96 |
| [Rh(2.1nm)/Ar(-1.7nm)]X5 + Rh(43nm) | Ar | 6.9 | Yes | 79 |

# THIN-FILM CRYSTALLINE STRUCTURE WITH SURFACES HAVING SELECTED PLANE ORIENTATIONS

RELATED PATENT DOCUMENTS

This is a continuation in part of U.S. patent application Ser. No. 16/196,228 filed on Nov. 20, 2018, now abandoned, which claims the benefit of U.S. Provisional Application No. 62/588,669 filed on Nov. 20, 2017, the contents of which are incorporated by reference in their entirety.

SUMMARY

The present disclosure is directed to a thin-film crystalline structure with surfaces having selected plane orientations. A crystalline structure can be formed with a selected orientation on each surface. The surface orientation selection is based on certain desired physical property, e.g. atomic packing factor, surface energy, mill rate, etc. Methods are described that facilitate forming a crystalline structure with desired orientation on each surface using, e.g., ion beam assisted deposition and ion beam etching. In one embodiment, a thin film structure (e.g., a near-field transducer), includes a first surface parallel to a substrate on which the thin film structure is deposited and two other surfaces orthogonal to the first surface. The first surface and the two other surfaces have respective first, second, and third selected plane orientations with respective first, second, and third atomic packing factors. The first, second, and third selected plane orientations are selected to maximize a combination (e.g., an average) of the first, second, and third atomic packing factors. For example, all of the first, second, and third plane orientations in an fcc material may be {100}. Or, the first orientation may be (100) and the second and third may both have a same orientation, wherein the same orientation is {110} or {210}.

In other configurations, the first, second, and third selected plane orientations may be selected to maximize an atomic packing factor of one of the first, second, and third atomic packing factors, and the other two plane orientations are selected such that an average of the first, second, and third atomic packing factors is greater than 0.70 for an fcc material. For example, {111} may be selected as the first plane orientation and {110} and {211} as the second and third plane orientations. Or, {111} may be selected as the second plane orientation and {110} and {211} as the first and third plane orientations, respectively.

In another embodiment, a method involves performing one or repetitions each involving depositing a layer of a material to a first thickness T1 and ion beam etching the layer of material to remove thickness T2, where T2<T1. After the repetitions, the resulting structure can be used as a template, in which case the method could further include depositing additional material to form a final structure. The template and additional material may be the same or different materials. The final structure may form an NFT that is deposited on a recording head.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIG. 6 includes perspective views of surfaces and corresponding fcc planes in a thin film structure to example embodiments;

FIGS. 7 and 8 are a table and chart showing surface orientations and atomic packing factor for thin film structure according to various embodiments;

DETAILED DESCRIPTION

The present disclosure is generally related to heat-assisted magnetic recording (HAMR), also referred to as energy-assisted magnetic recording (EAMR), thermally-assisted recording (TAR), thermally-assisted magnetic recording (TAMR), etc. In a HAMR device, a near-field transducer (NFT) concentrates optical energy into a tiny optical spot in a recording layer, which raises the media temperature locally, reducing the writing magnetic field required for high-density recording. A waveguide delivers light to the near-field transducer and excites the near-field transducer.

Figure 1:
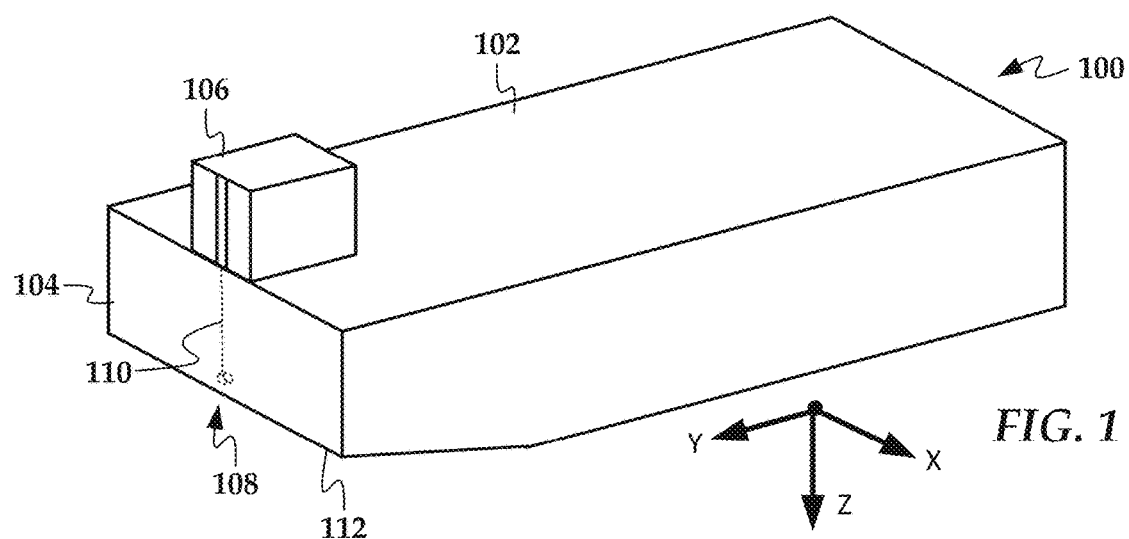
FIG. 1 is a perspective view of a slider assembly according to an example embodiment.

In reference now to FIG. 1, a perspective view shows a read/write head 100 according to an example embodiment. The read/write head 100 may be used in a magnetic data storage device, e.g., HAMR hard disk drive. The read/write head 100 may also be referred to herein interchangeably as a slider, head, write head, read head, recording head, etc. The read/write head 100 has a slider body 102 with read/write transducers 108 at a trailing edge 104 that are held proximate to a surface of a magnetic recording medium (not shown), e.g., a magnetic disk.

The illustrated read/write head 100 is configured as a HAMR device, and so includes additional components that form a hot spot on the recording medium near the read/write transducers 108. These HAMR components include an energy source 106 (e.g., laser diode) and a waveguide 110. The waveguide 110 delivers electromagnetic energy from the energy source 106 to a near-field transducer (NFT) that is part of the read/write transducers 108. The NFT achieves surface plasmon resonance and directs the energy out of a media-facing surface 112 to create a small hot spot in the recording medium.

Figure 2:
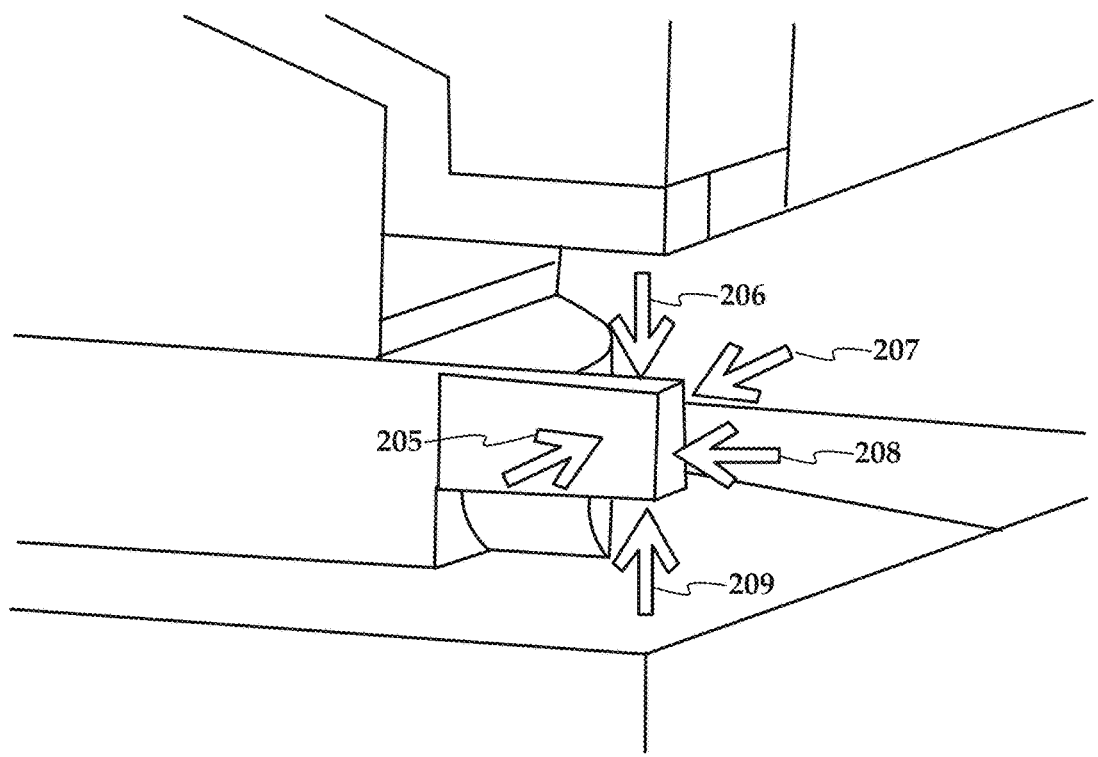
FIG. 2 is a perspective view of a near-field transducer and write pole according to according to an example embodiment.

There are at least two general types of near-field transducers, one type using a sub-wavelength metallic aperture (for instance, C-aperture, plasmonic gap waveguide) and the other one uses an optical antenna with an extended or protruded tip (peg). An example of the latter is shown in FIG. 2, which is a perspective view of a near-field transducer 200 according to an example embodiment. The near-field transducer 200 is near a write pole 202 that are both proximate a media-facing surface 204 (e.g., air-bearing surface or ABS) that faces a magnetic recording medium (not shown). The near-field transducer 200 has an enlarged part 200a and peg 200b, although the embodiments described below may also include peg-only embodiments, and/or aperture embodiments. Further, the techniques used to form the near-field transducers may be used for any thin film structure that is formed of a material with a crystalline microstructure, e.g., metals, dielectrics, semiconductors.

The activation of a near-field transducer utilizes the excitation of local surface-plasmon (LSP) at the interface between a plasmonic metal of free electrons and a dielectric material. On resonance, the optical energy from a light delivery dielectric waveguide can be concentrated into a local volume. Field-line concentration occurs at a local shape singularity, such as a gap or a tip, due to the collective oscillations of electrons in the metal, which increases the interaction between light and matter peg coupler.

One major obstacle that prevents practical applications of such an NFT is reliability. A near-field transducer that interacts with light to generate a confined hot spot in a recording media also absorbs light, resulting in temperature rise of the NFT. This temperature rise degrades the NFT performance, e.g., by causing the NFT to change shape, making the NFT more susceptible to oxidation, causing separation and/or voids within the NFT and/or between the NFT and surrounding materials, etc.

One way to combat this type of failure is to use a mechanically robust plasmonic material of high melting temperature, such as Pd, Rh, Ir, and Pt, as the peg layer. Unfortunately, these materials are usually of high plasmonic loss and low thermal conductivity. Moreover, to obtain high thermal gradient (>10 K/nm), thermal background (from far-field excitation light and near-field light of the NFT except for the peg) is removed and only the near field from the peg will heat a recording media. This results in large temperature rise (for instance, >400° C.), causing head failure from, for example, peg deformation, peg oxidation, material separation, head overcoat removal, and dielectric material recess and corrosion. Oxidation and corrosion can arise even at non-elevated temperatures, e.g., due to normal mechanical wear of the ABS overcoat.

Figure 3:
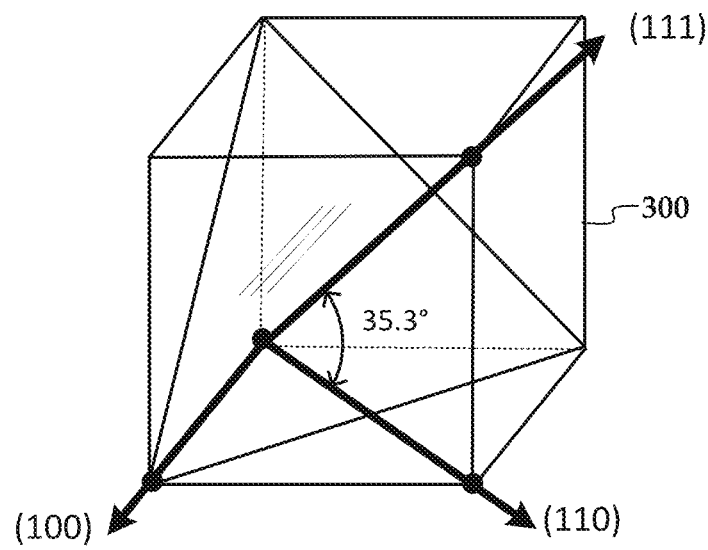
FIG. 3 is a perspective view showing the vector orientations of an fcc crystal used in a thin film structure according to an example embodiment

One way to combat these effects of temperature rise and/or oxidation (and possibly improve characteristics such as thermal conductivity) is to form the NFT such that vulnerable surfaces are in particular crystalline orientations that minimize the negative effects of temperature rise and/or oxidation, on these surfaces. In FIG. 3, a perspective view shows the vector orientations {111}, {100}, {110} of an fcc crystal 300 using in forming an NFT according to an example embodiment. Oxidation risk in fcc metals is known to be orientation-dependent, with correlation to planar atomic packing factor (APF) of a certain crystallographic plane. Planes with lower APF have more open space for oxidant diffusion and thus higher oxidation risk.

Figure 5:
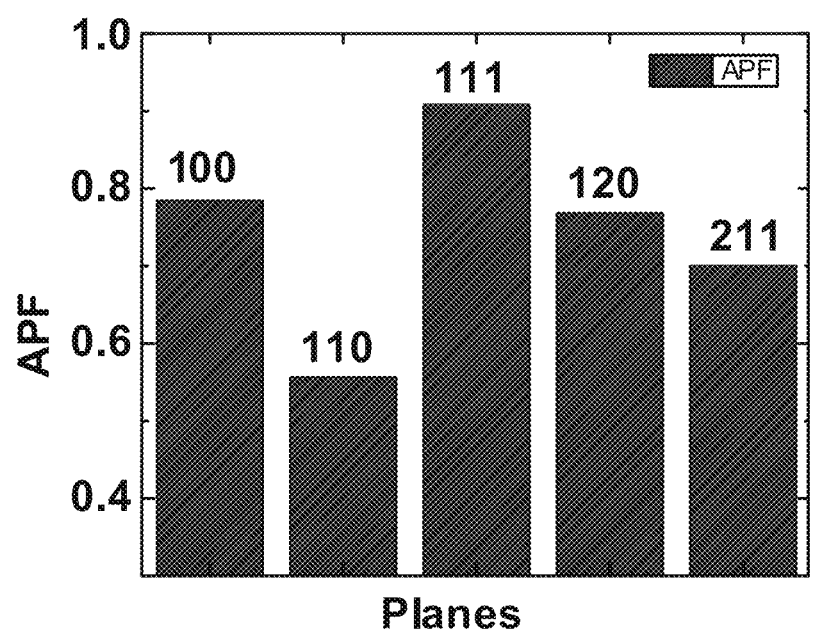
FIG. 5 is a bar graph showing the atomic packing factor of various fcc planes in a thin film structure according to an example embodiment.
Figure 4:
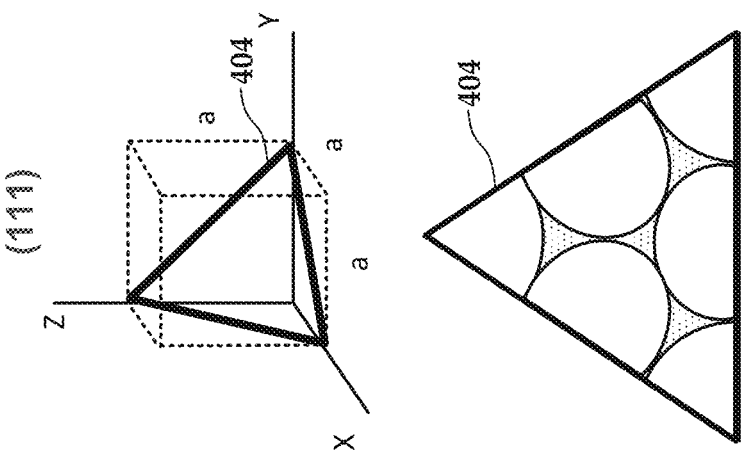
FIG. 4 shows the atomic packing factor for the main planes of an fcc material in a thin film structure according to an example embodiment.
Figure 4:
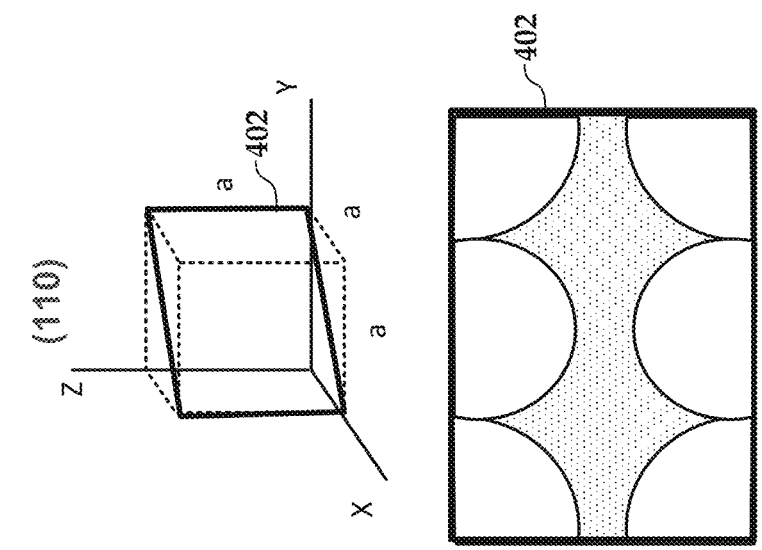
Figure 4:
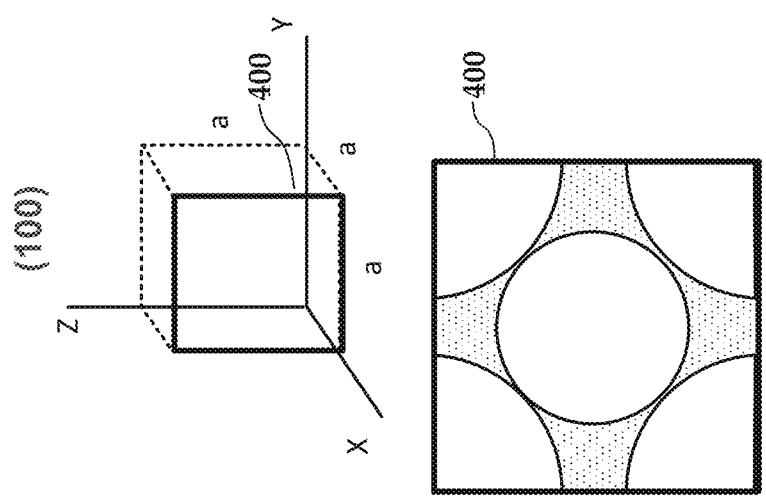

In FIG. 4, the APF of the main fcc planes 400, 402, 404 can be seen to follow this order: {111}>{100}>{110}. Accordingly, the oxidation risk of main fcc planes follows the order: {111}<{100}<{110}. See the chart of FIG. 5, which shows APFs of more planes than illustrated in FIG. 4. To minimize oxidation risk, it can be desirable in some embodiments to align a particular Rh peg surface to the highest APF plane {111} and to avoid the lowest APF plane {110}. In other embodiments, it may be desirable to find the highest combination (e.g., average, median, etc.) APF for two, three or more of the surfaces, even though none of the surfaces may be at the highest APF orientation {111}. For other thin film structures besides and including NFTs, surfaces may be selectively formed with high APF surfaces to enhance other characteristics, such as electrical or thermal conductivity, optical characteristics, resistance to separating from adjacent materials, etc.

In reference again to FIG. 2, there may be as many as five surfaces/interfaces 205-209 in a Rh peg that have oxidation risk either through direct exposure to $O_2/H_2O$ or through diffused $O_2/H_2O$ at an interface, e.g., with a dielectric or any other different material. It is not possible to have {111} in all three orthogonal directions involved in the five surfaces due to crystallographic orientation relationship. Nonetheless, it is possible to arrange crystallographic orientations in a Rh peg (or other fcc metal) such that the overall risk of oxidation from all five surfaces is minimized (or a selected subset thereof). In other embodiments, the crystallographic orientations can be selected to distribute oxidation risk amongst the different surfaces, such that higher risk surfaces have the highest APF, while maximizing APF for other surfaces to the extent possible.

In one approach, the orientations are selected to maximize effective averaged APF, with minimum APF avoided on any surfaces and interfaces. This involves determining average surface packing factor for all surfaces: $\Sigma APF_i\ Area_i/\Sigma Area_i$, which is a weighted average of the APF based on sizes of the respective surfaces compared to the total area of the surfaces. There are five surface interfaces as seen in FIG. 6: ABS X1, Top/Bottom X2, Side X3. For purposes of this analysis, the dimensions of an example NFT are on the order of 50 nm (width)×50 nm (height)×20-100 nm (length). All possible peg orientation arrangements made out of {100}-oriented single-crystalline Rh films ({100} growth direction is perpendicular to X2) were considered to obtain the results in the top section 700 shown in the table of FIG. 7.

In another approach, APF at a particular surface/interface of interest can be maximized. This is shown for a first combination of surface orientations in sections 701-703 of FIG. 7. The combinations shown in these sections 701-703 prioritize planes with higher APFs to peg surface/interfaces with more severe oxidation observed in failure analysis.

Different combinations (not shown) may be selected in cases where different surfaces are seen to have more severe oxidation different than what are used to derive the example shown in FIG. 7. For any selection of surfaces for which oxidation is desired to be minimized, the {111}-highest APF is placed at the surface/interface of interest. The orientations in other peg directions arranged with what is crystallographically allowed.

Figure 8:
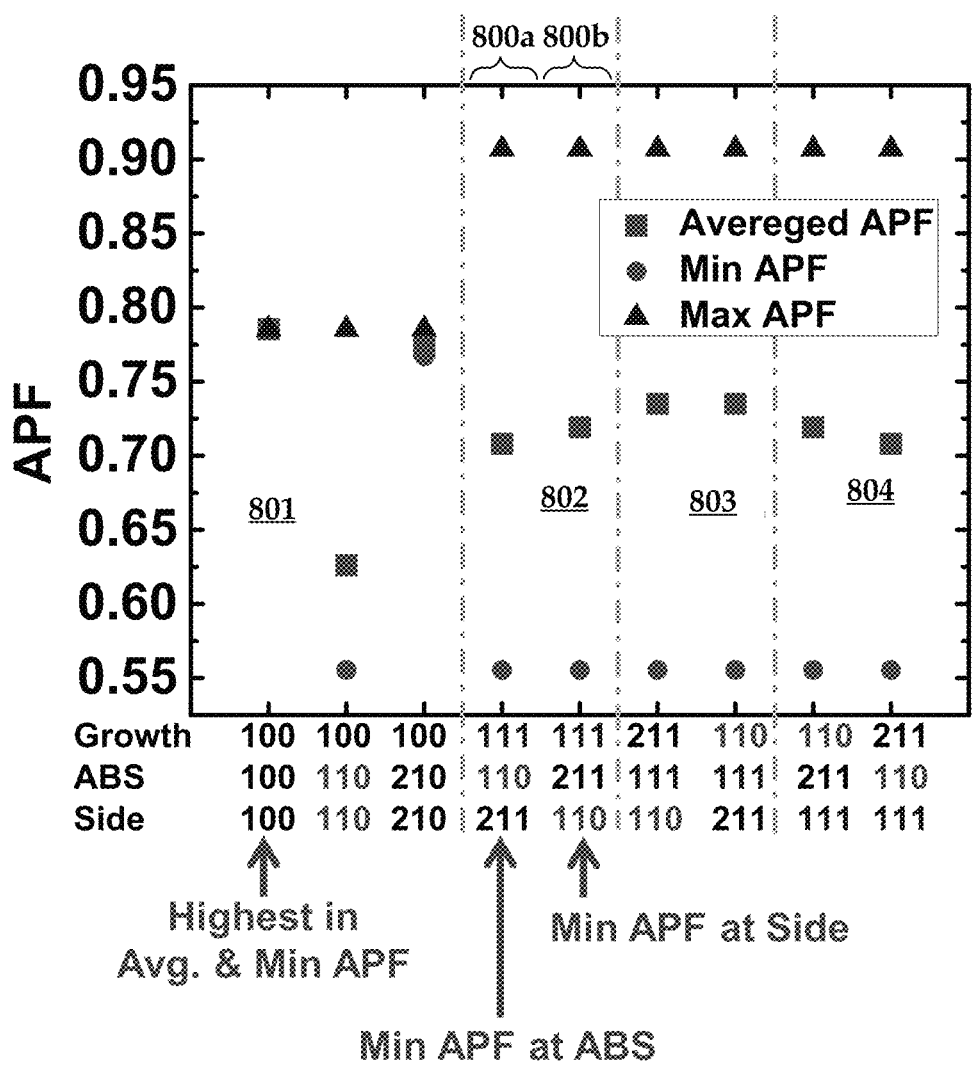

Any example of this analysis for the indicated surface selection is shown in the graph of FIG. 8. The peg dimensions considered were: 20 nm (length)×50 nm (width)×50 nm (height). Five surfaces were considered: ABS X1, top/bottom X2, side X3, with the growth plane being parallel to the top/bottom. The arrangement of results in section 801 shows that {100} in all surfaces (leftmost column in graph) results in highest in average and minimum APF. This arrangement has no highest APF in any surfaces, and no lowest APF in any surfaces.

The arrangement in section 802 shows an arrangement of growth-{111} and side-{110}. This case has the highest APF in top/bottom surfaces and the lowest APF not facing the ABS. The arrangement in section 803 is {110}-Growth, {111}-ABS. The highest APF is at the ABS in this arrangement.

To summarize, an embodiment with highest averaged APF may include one of: growth-{100}, ABS-{100}, side-{100}; or, growth-{100}, ABS-{210}, side-{210}. Another embodiment with highest APF at the ABS may include one of: growth-{211}, ABS-{111}, side-{110}; or, growth-{110}, ABS-{111}, side-{211}. Another embodiment with highest APF at top/bottom may include one of: growth-{111}, ABS-{211}, side-{110}; or, growth-{111}, ABS-{100}, side-{211}. Another embodiment with highest APF at sides include one of growth-{110}, ABS-{211}, side-{111}; or, growth-{211}, ABS-{110}, side-{111}. These arrangements may allow minimizing oxidation or other deterioration at selected sides of a structure, such as an NFT. In other cases, the orientations may be selected so that a certain orientation facing the ABS surface exhibits a desired lapping removal rate to form desired topographic features relative to other structures at ABS. Note that in other embodiments, the combinations above may be selected to obtain a highest average of two of the surfaces.

Figures 9, 10, 11:
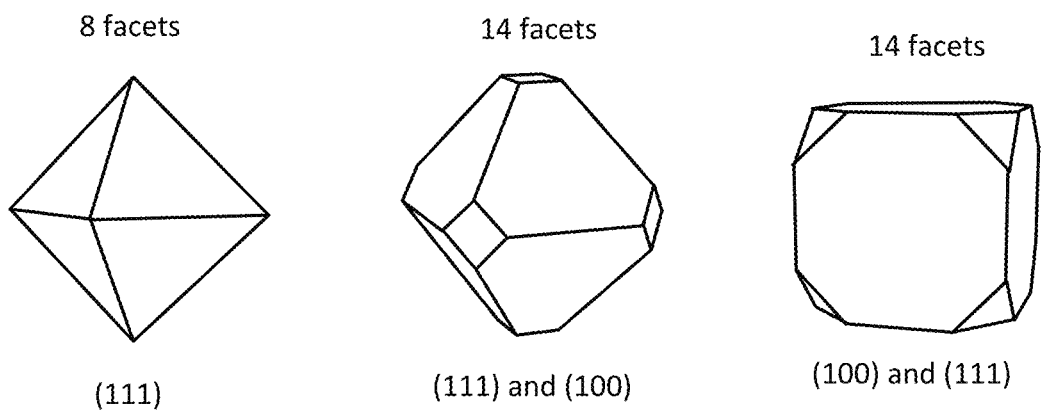
FIGS. 9-11 are views of a faceted, single-crystal material that may be used in a thin film structure according to example embodiments.

In FIGS. 9-11, views show a polyhedron with {111} and/or {100} facets with high APF planes according to example embodiments. This can be used when forming an NFT out of irregular shaped Rh single-crystalline. The Rh single-crystalline is faceted with planes with higher APF, e.g. {111}, {100}, etc. This will result in no low-APF plane, e.g. {110}, being on any NFT surfaces.

The approaches described above may be used for any fcc metal (e.g., Rh, Ir, Pd, Pt) that has a free surface or a surface that interfaces with a dielectric or some other different material. The approaches may be used for other crystal systems, such as body centered cubic (bcc) and hexagonal close packed (hcp). In other arrangements, the orientation of particular surfaces (e.g., one surface, or the combination of surface energies of two, three or more surfaces) may be selected based on minimization of surface energy. Surface energies of the various crystal faces of Rh and Ir have enough differences that certain peg orientations may be more thermodynamically stable and minimize the tendency to reorient. In Table 1 below, surface energies for various plane indices are shown for Rh and Ir.

TABLE 1

| Plane index | Rh surface energy (ergs/cm$^2$) | Jr surface energy (ergs/cm$^2$) |
| --- | --- | --- |
| 123 | 2968 | 3148 |
| 133 | 2922 | 3099 |
| 113 | 2937 | 3073 |
| 102 | 3018 | 3129 |
| 212 | 2717 | 2867 |
| 112 | 2905 | 3090 |
| 001 | 2896 | 2895 |
| 101 | 2915 | 3047 |
| 111 | 2593 | 2824 |

Figure 12:
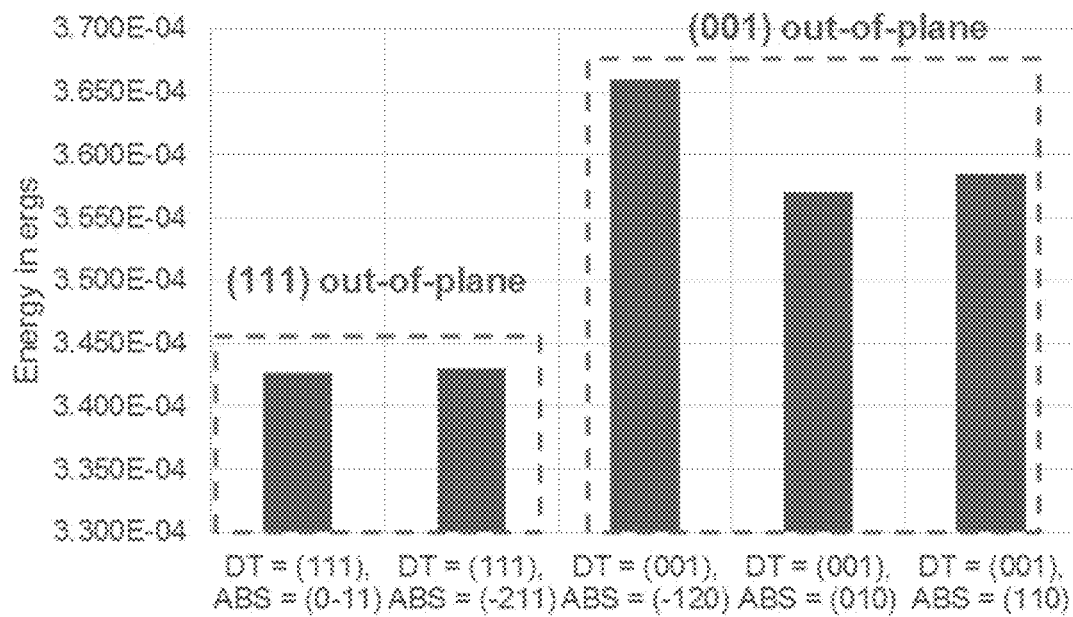
FIGS. 12 and 13 are graphs showing surface energy verses crystalline orientation for a thin film structures according to example embodiments.
Figure 13:
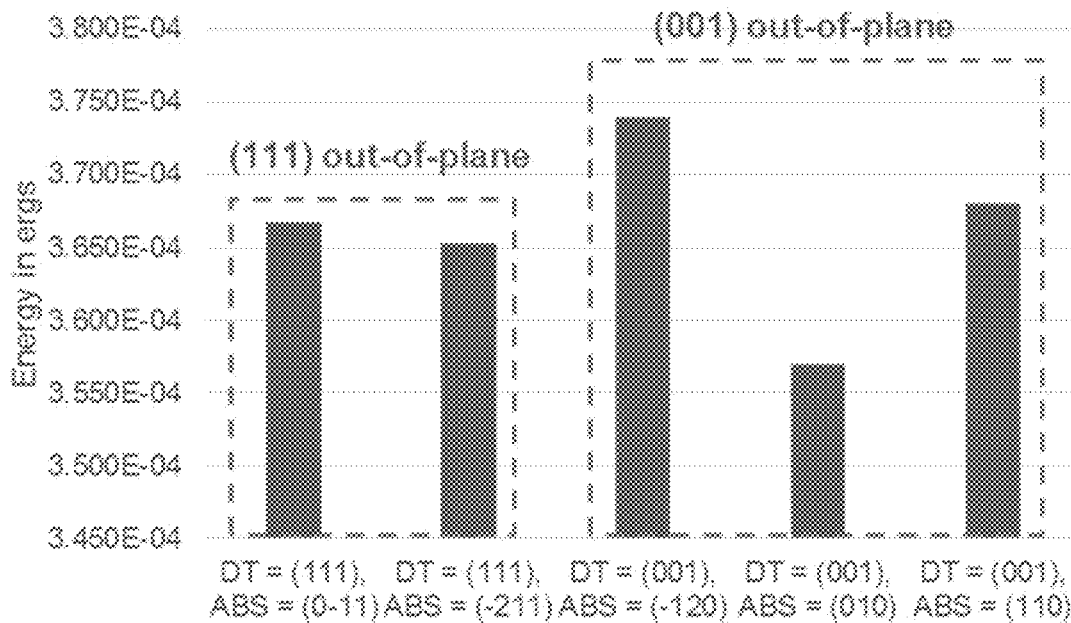

Energy differences between orientations scale with peg surface area. As before, the orientations can be selected that reduce a weighted surface energy based on surface size: $\Sigma SurfaceEnergy_i Area_i / \tau Area_i$. For 60 nm length and assuming surface energy values not changed with interfaces with other materials in a NFT device, lowest energy configurations are, for Rh, {111} out-of-plane texture, with (0-11) oriented at ABS. For Ir, the lowest energy configurations are {001} out-of-plane texture, with {010} oriented at ABS. As with previous embodiments, a predetermined orientation can improve performance, such as by reducing recession at the ABS, reducing separation/voids at material interfaces, etc. Note that for an NFT, the out-of-plane edges correspond to downtrack (DT) sides (see sides 206 and 209 in FIG. 2). In FIGS. 12 and 13, graphs provide details of these results for Rh and Ir.

In the embodiments described above, an NFT is formed having a particular crystal orientation such that the ABS facing end and dielectric facing sides have particular properties, e.g., relatively high APF and/or relatively low surface energy. In existing processes, NFT plasmonic metal materials are deposited at room temperature onto a dielectric surface, which usually results in polycrystalline growth. While the NFT metals usually have a {111}-dominated fcc texture, there is a broad distribution in {111} grain alignment. For example, plasmonic NFT peg materials (e.g., Au, Ir, Rh, Pt, Pd), being deposited onto a flat surface: broad {111} distribution from the film normal direction. And such distribution becomes even worse with metals with higher melting points (e.g., Ir and Rh).

Accordingly, methods are described that enable forming NFT (or other structure) with a desired crystal orientation. In some embodiments, the structure may be formed as a single crystal, e.g., on a carrier wafer separate from the target wafer (e.g., read/write head). In order to utilize existing tooling and to make the process simple and straightforward, it is desirable to deposit the material directly onto the target, yet have the deposited material layer maintain biaxial texture such that the out-of-plane crystal orientation of the layer and at least one other orthogonal plane orientation of the layer are mostly at desired grain alignments. Ways to improve fcc {111} texture on sheet films deposited on a flat surface include ion beam assisted deposition and deposition plus directional ion mill. Deposition can occur within any range from cryogenic to room temperature (e.g., 25° C.+−10° C.) to high temperature (e.g., above 100 C). A post-deposition anneal may be used, deposition thickness may be limited below the critical thickness at which preferred growth texture switches from {111} to {001} due to the competition between surface energy anisotropy and strain energy anisotropy. Ways to improve fcc {111} texture vertical alignment in a nano-device deposited into a trench (or other growth surface) also include ion beam assisted deposition, deposition plus directional ion mill, deposition at cryogenic temperature, room temperature or high temperature, and post-deposition anneal.

Figure 14:
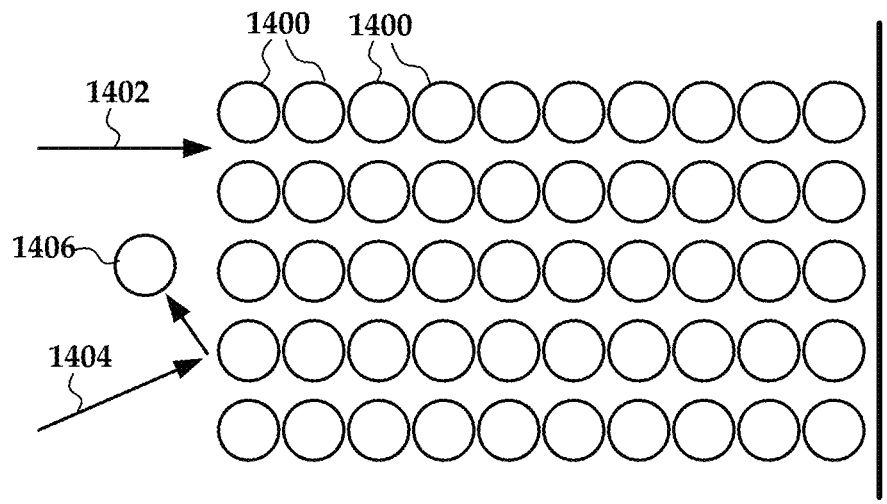
FIG. 14 is a diagram showing ion beam etching channeling effect according to an example embodiment.

Ion beam removal rate depends on orientation. As seen in the block diagram of FIG. 14, an arrangement of atoms 1400 include an open channel direction 1402. Orientations with open channels in the beam direction have lower sputter yield than those with channels that are not aligned with the beam. The latter is indicated by ion direction 1404 and sputtering atom 1406. Lower sputtering rate result for aligned crystallites compared to unaligned crystallites. The easiest channeling directions are <110>, <100>, <111> for fcc: <111>, <100>, <110> for body-centered cubic (bcc), and <1120>, <0002> for hexagonal close-packed (hcp). Note that the ion direction 1404 is substantially normal to a substrate plane 1406 upon which the atoms 1400 are deposited.

In one embodiment, metal deposition plus ion beam etching (IBE) mill generally involves alternating between deposition and milling. Note that this and other embodiments may use any combination of deposition methods, such as sputter, ion beam deposition, evaporation, chemical vapor deposition, etc. In situ deposition and IBE can be performed on the same tool without vacuum break. IBE can be done by an assisted beam source within the same vacuum chamber as the deposition. In such a configuration, deposition and etching removal can be done in alternating steps or in the same step with depositing and etching simultaneously. Gases used in IBE include Ar, Ne, N$_2$, Kr, and Xe. The IBE can be vertically aligned with normal incidence. Deposition plus IBE removal can involve repeating the following operations: 1) Deposit thickness T1 of material; 2) IBE removal of T2 of the material, where T2<T1. The value of T1 and T2 may be, e.g., 2 nm and 1 nm respectively. Non-vertically aligned {111} grains remove faster than vertically aligned {111} grains. This results in a preferred vertically aligned {111} texture.

Figure 15:
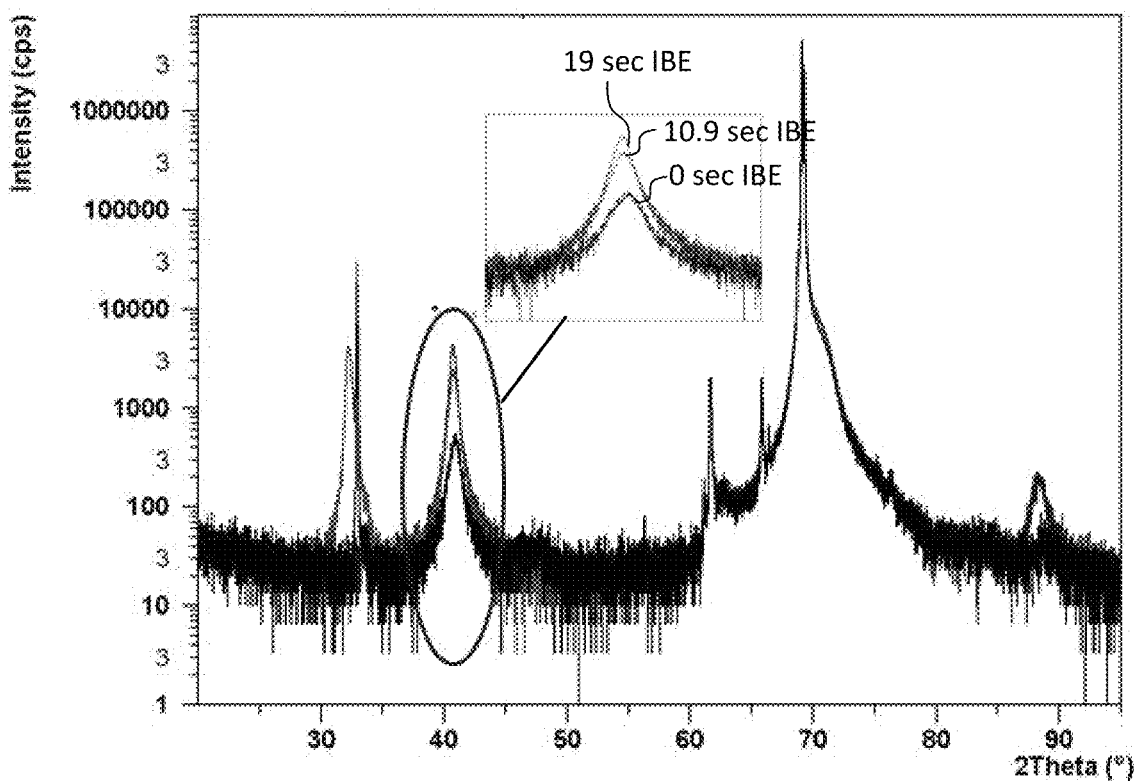
FIG. 15 is an X-ray diffraction (XRD) θ-2θ scan plot of ion beam assisted Rh material layers according to example embodiments.
Figure 16:
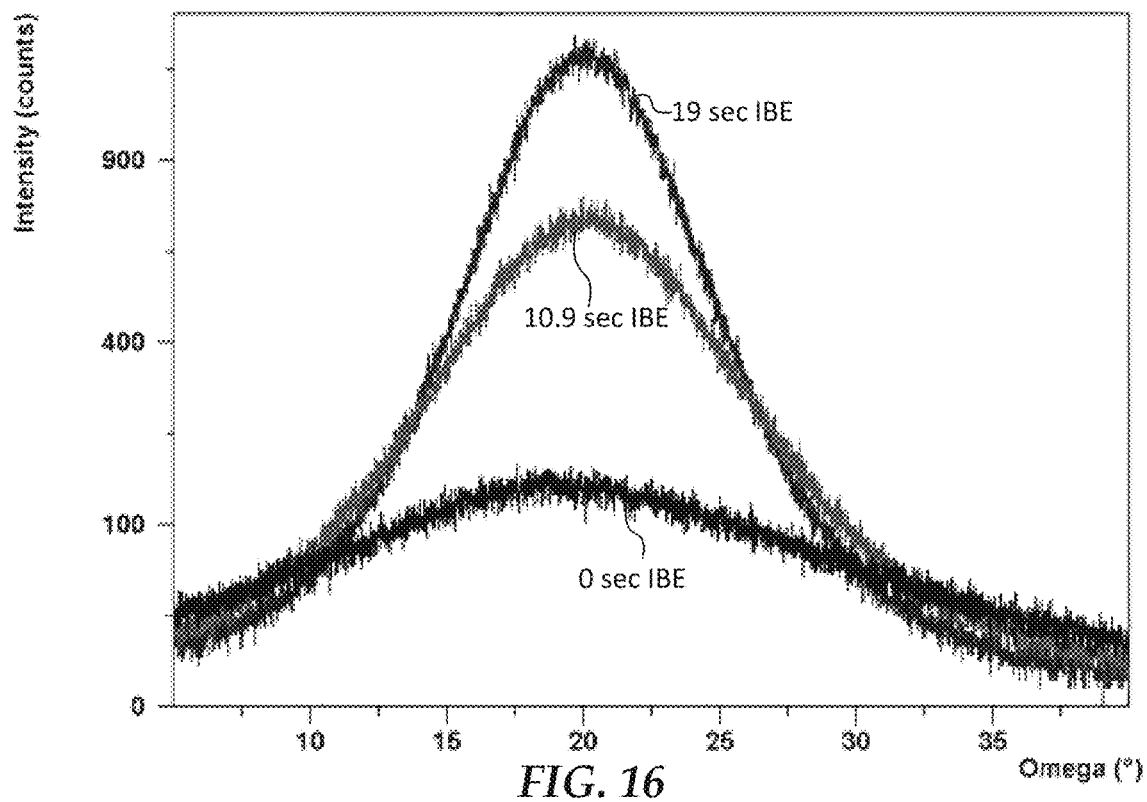
FIG. 16 is an {111} XRD omega rocking curve of ion beam assisted Rh material layers according to example embodiments.

One embodiment involves Rh film Deposition on to a flat substrate surface with ion beam assistance. A 2 nm layer of Rh is deposited followed by IBE removal of 1 nm of Rh. This repeats one or more times to reach a final targeted thickness. The layers formed in this way can be used as a template before forming a peg and/or other NFT feature using normal Rh or Ir deposition (e.g., without ion beam assistance). In FIG. 15, an X-ray Diffraction (XRD) θ-2θ scan plot shows ion beam impact on Rh{111} deposited on a Si substrate. A 2 nm layer of Rh was subjected to IBE for 0, 10.9, and 19 seconds as indicated in the figure, which resulted in removal of 0, 5, and 10 Å of material and Rh{111} grain size of 9.8, 14.4, 17.4 nm, respectively. With increase in ion beam etch time, more Rh{111} is aligned out-of-plane, and Rh{111} grains become bigger. In FIG. 16, a graph shows an XRD omega rocking curve on Rh{111} diffraction with the same etched samples. The peak width of an Omega rocking curve indicates how well grains with the same orientation are aligned relative to the normal direction. In this case, for 0, 10.9, and 19 seconds IBE, Rh{111} ω-FWHM is 14.1°, 10.1°, and 7.8°, respectively.

Figure 17:
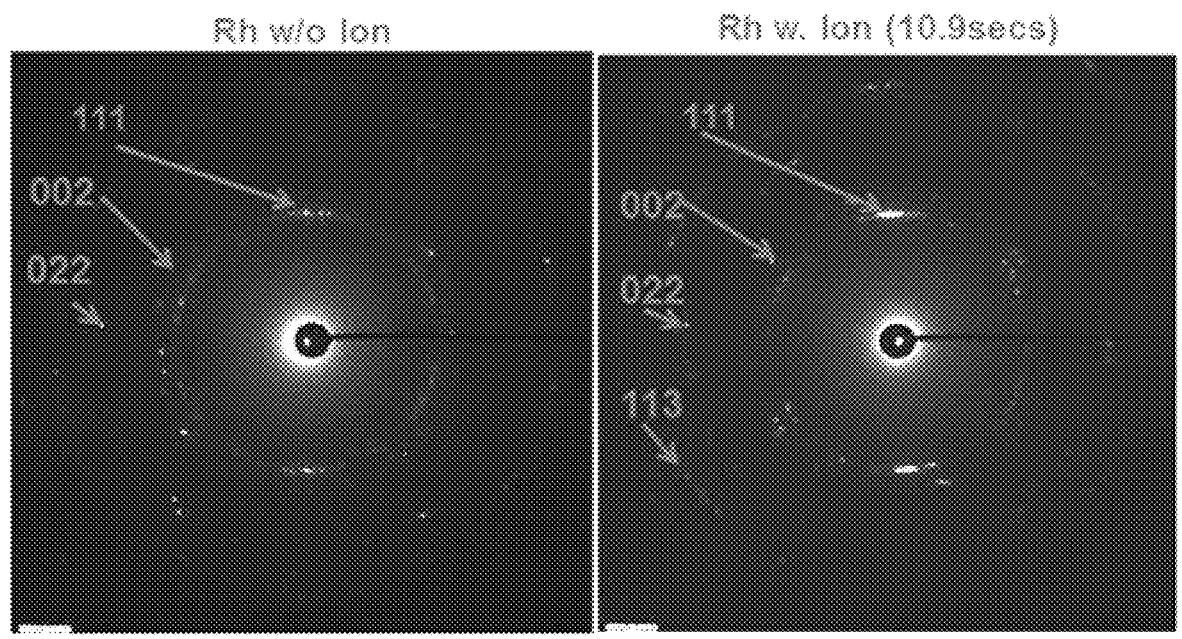
FIG. 17 is a set of transmission electron microscope images showing selected area electron diffraction of ion beam assisted Rh material layers according to example embodiments.
Figure 18:
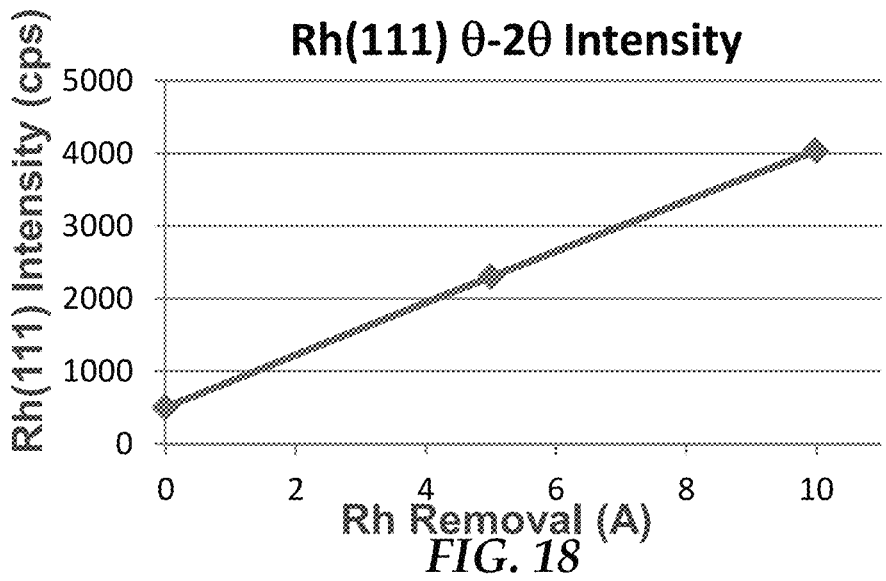
FIGS. 18, 19, 20, and 21 are graphs showing effects of ion beam assistance of Rh for various etch times according to example embodiments.
Figure 19:
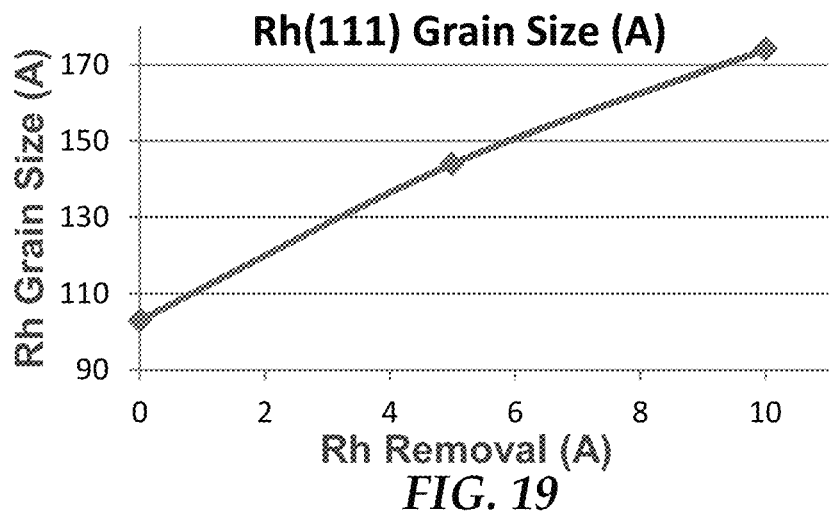
Figure 20:
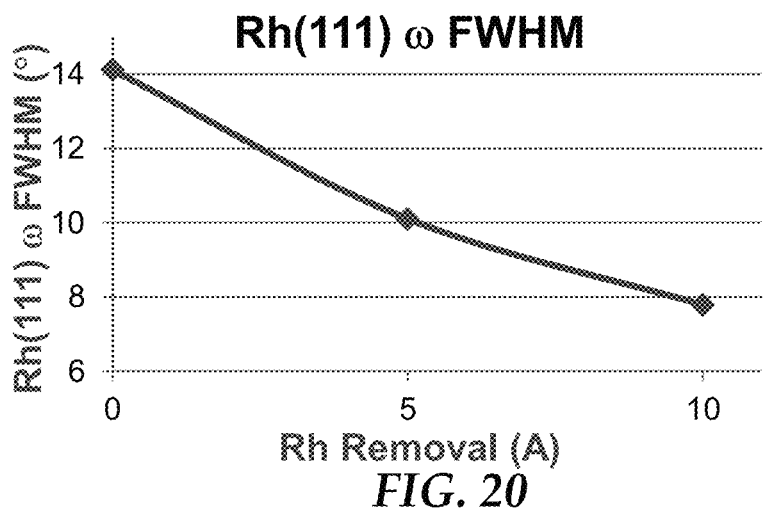
Figure 21:
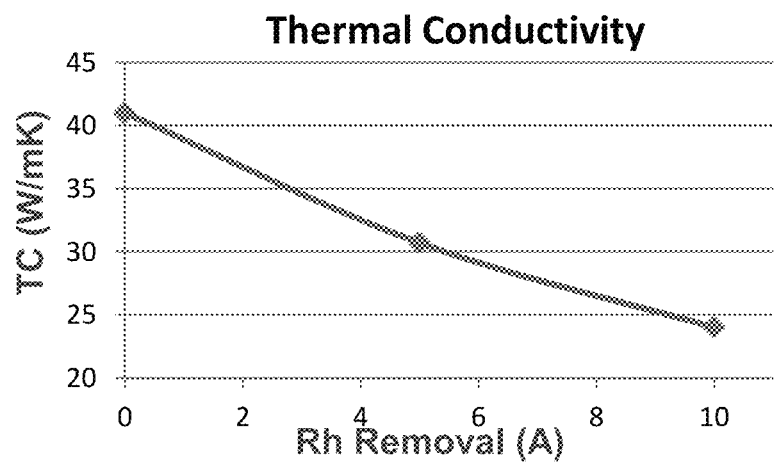

In FIG. 17, images show results of a transmission electron microscope (TEM) selected area (electron) diffraction (SAD) on cross-sectional samples for the Rh having no IBE (left-hand side) and with 10.9 seconds of IBE (right-hand side). The vertical direction in the images are alone the film growth direction. Without ion beam assistance, there is some preference of {111} out-of-plane texture. But there are {111}-oriented grains that are not aligned to the growth direction and as a result, all Rh{111} diffraction is a more continuous ring. With ion beam assistance, there is much weaker diffraction from other orientations, much stronger Rh{111} texture, and majority of Rh{111} is aligned alone out-of-plane. As a result, it can be seen that ion beam assistance greatly enhances Rh{111} growth.

In FIGS. 18-21, graphs summarize the effects of IBE on Rh{111} for various etch times. With increase in ion beam etch time, more Rh{111} is aligned along out-of-plane, Rh{111} grains become bigger, and distribution of Rh{111} along out-of-plane becomes sharper and sharper. Note that for these samples, thermal conductivity (TC) decreases, possibly due to Ar impurity.

Figure 22:
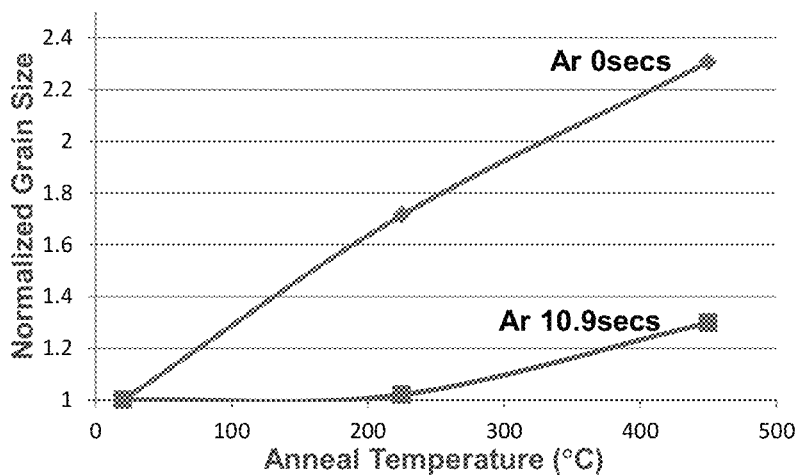
FIGS. 22 and 23 are graphs showing the effects of annealing on ion beam assisted Rh layer according to example embodiments.
Figure 23:
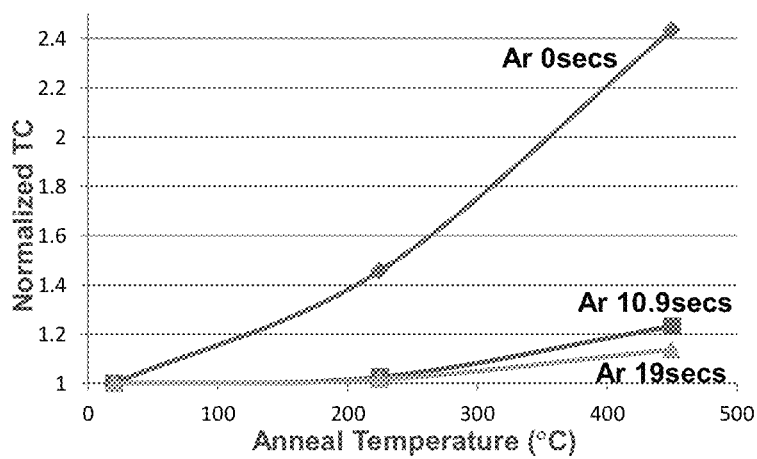
Figure 24:
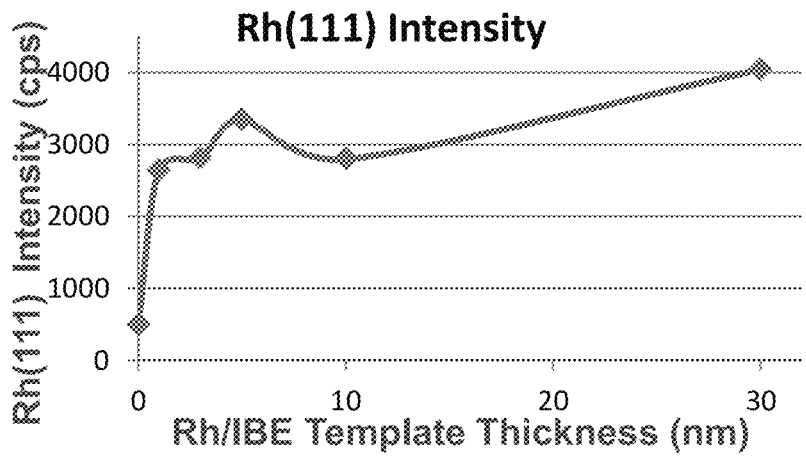
FIGS. 24, 25, 26, and 27 show the effect of template thickness on an Rh structure according to example embodiments.
Figure 25:
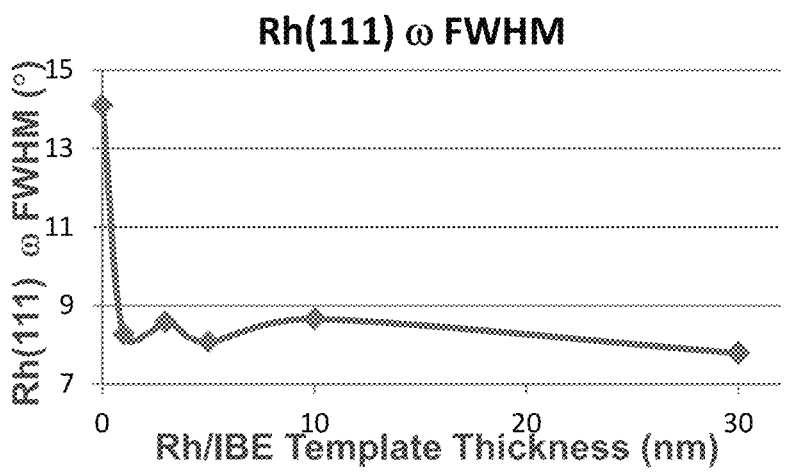
Figure 26:
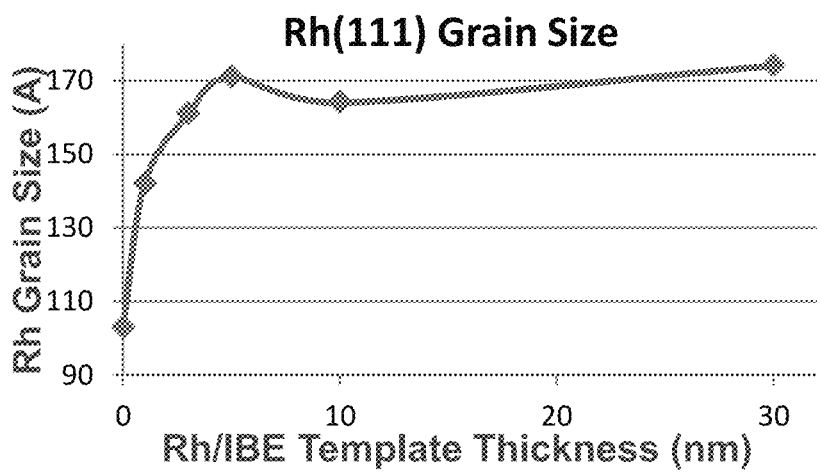
Figure 27:
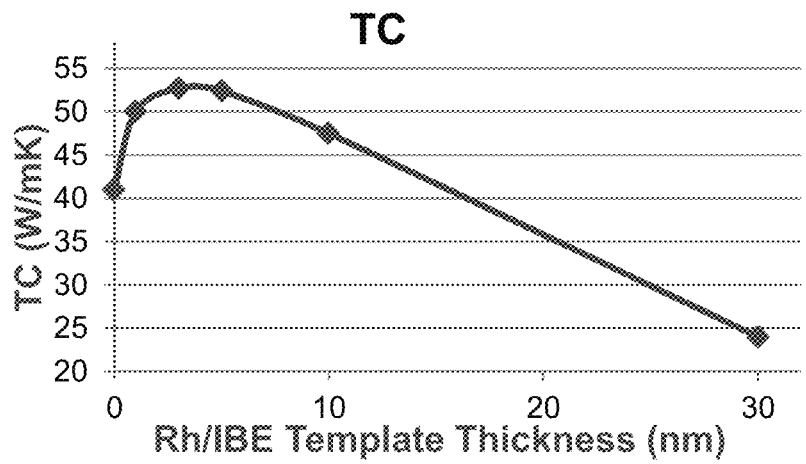

Annealing the material after the above deposition and IBE repetitions can increase both grain size and TC. As seen in the graphs of FIGS. 22 and 23, annealing increases grain size and TC for both non-IBE and IBE milled Rh. Generally, a longer ion beam etch increases Rh grain stability, e.g., less changes in grain size and TC. Possible origins of grain stability include Ar impurities pinning Rh grains and the improved Rh{111} texture reducing the tendency of grain re-orientation.

In order to build thicker structures, a relatively thin layer of Rh may be deposited and IBE milled as described above, and then additional material deposited using regular method without ion beam etch to a target thickness. For example, in one embodiment a template may be a 2 nm Rh layer with 19 second IBE followed by Rh deposition to achieve up to a 30 nm total thickness. In FIGS. 24-27, graphs show the effect of template thickness on various measures previously described. The Rh/IBE template is effective to improve Rh{111} texture, produce larger grain size, and improve TC. An optimized template thickness in this configuration is about 3-5 nm, resulting in an increase of the largest grain size by about 70% and an increase in the highest TC by about 30%. In such a thin template+thick regular bulk deposition approach, the benefits of IBE selective removal of non-aligned grains are maintained while the risk of Ar impurity is minimized.

Figure 28:
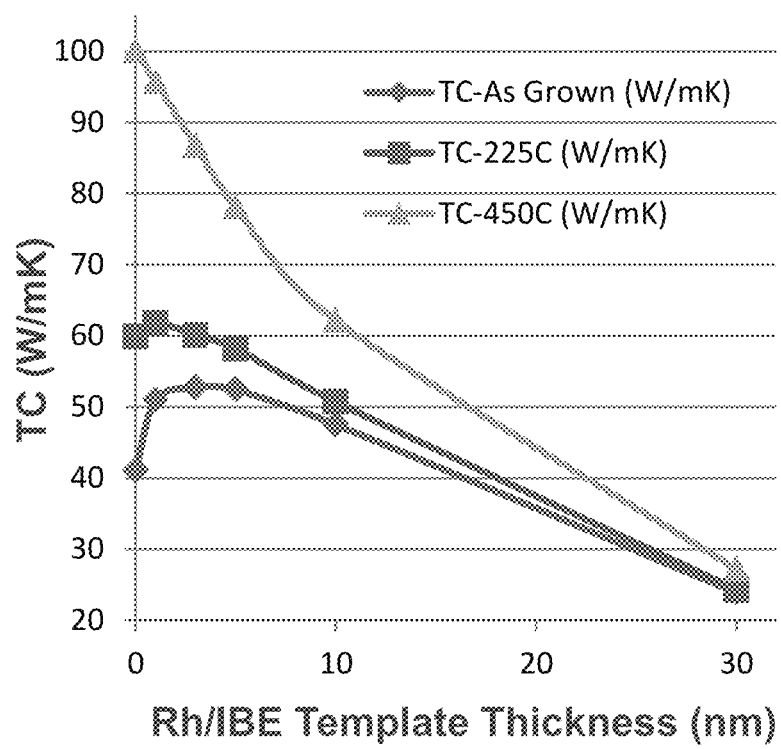
FIGS. 28 and 29 are graphs showing the effects of annealing on Rh layer on an ion beam assisted template according to example embodiments.
Figure 29:
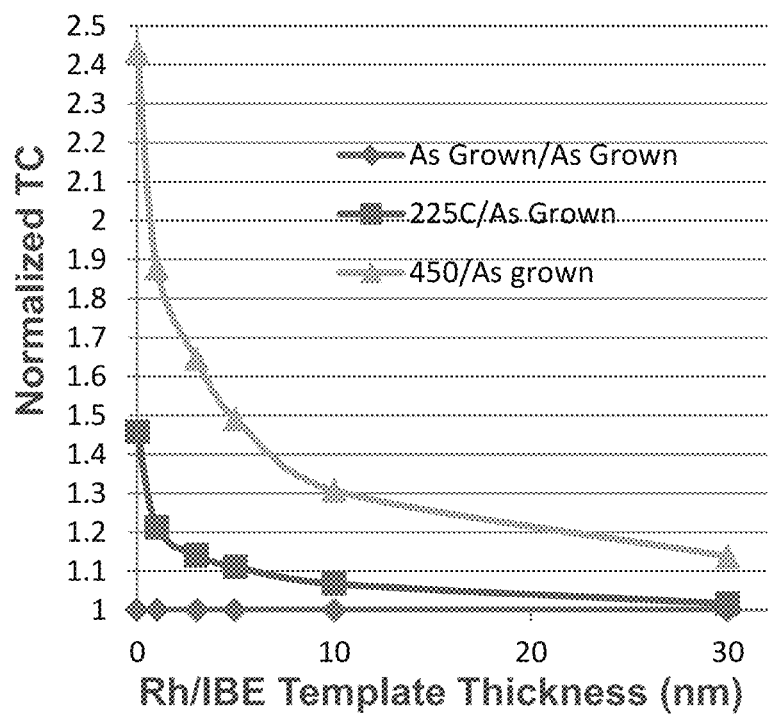

In FIGS. 28 and 29, graphs show TC versus template thickness for a 225 C and 450 C post anneal. Rh/IBE template is able to preserve grain stability from Ion beam effect. At least part of the observed grain stability is due to enhanced Rh{111} texture, reducing tendency of grain re-orientation. For template thickness of 0 nm (no template), grain size is 10 nm and ATC at 225 C is about 50%, ATC at 450 C is about 140%. With a 5 nm template, grain size is 17 nm and ATC at 225 C is about 10%, ATC at 450 C is about 50%.

Figure 30:
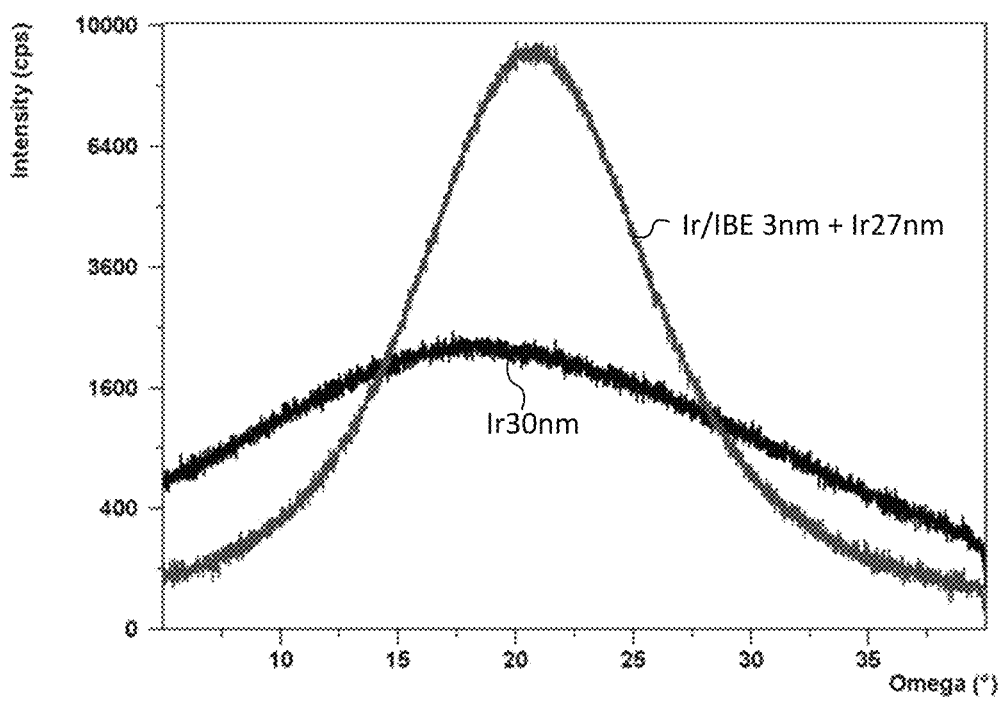
FIG. 30 is an XRD omega rocking curve of ion beam assisted Ir material layers according to example embodiments.

In another embodiment, a similar deposition and IBE is performed using Ir. For example, 2 nm of Ir is deposited onto a flat substrate surface followed by IBE removal of 1 nm resulting in a 1 nm thickness remaining. This can be repeated one or more times to reach a final targeted thickness. This process can be used to form a template over which is deposited more Ir with no further IBE. The graph in FIG. 30 is an XRD omega rocking curve of Ir{111} diffraction showing intensity of a 30 nm Ir control deposition (Ir30 nm), and a 3 nm Ir/IBE template followed by 27 nm deposition of Ir (Ir/IBE 3 nm+Ir27 nm). Table 2 below shows results for these cases as well as a 5 nm Ir/IBE template followed by 25 nm of Ir. The first row in Table 2 indicates diffraction intensity ratio in XRD θ~2θ scan between Ir{111} and Si{400}.

TABLE 2

| | Ir30 nm | Ir/IBE 3 nm + Ir27 nm | Ir/IBE(5 nm) + Ir25 nm |
|---|---|---|---|
| I_Ir{111}/I_Si400 | $3.9 \times 10^{-4}$ | $2.6 \times 10^{-3}$ | $2.4 \times 10^{-3}$ |
| Ir{111} FWHM (°) | 1.08° | 0.965° | 0.920° |
| Grain Size (A) | 87 | 97 | 102 |
| Ir{111} ω FWHM | 17.2° | 7.08° | 7.02° |

Figure 31:
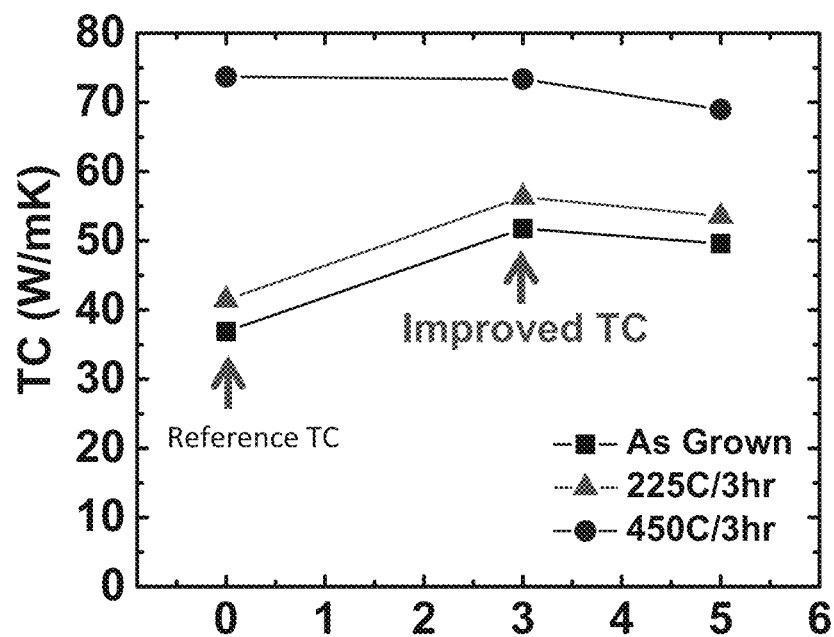
FIGS. 31 and 32 are graphs showing the effects of annealing on Ir material layers on an ion beam assisted template according to example embodiments.
Figure 32:
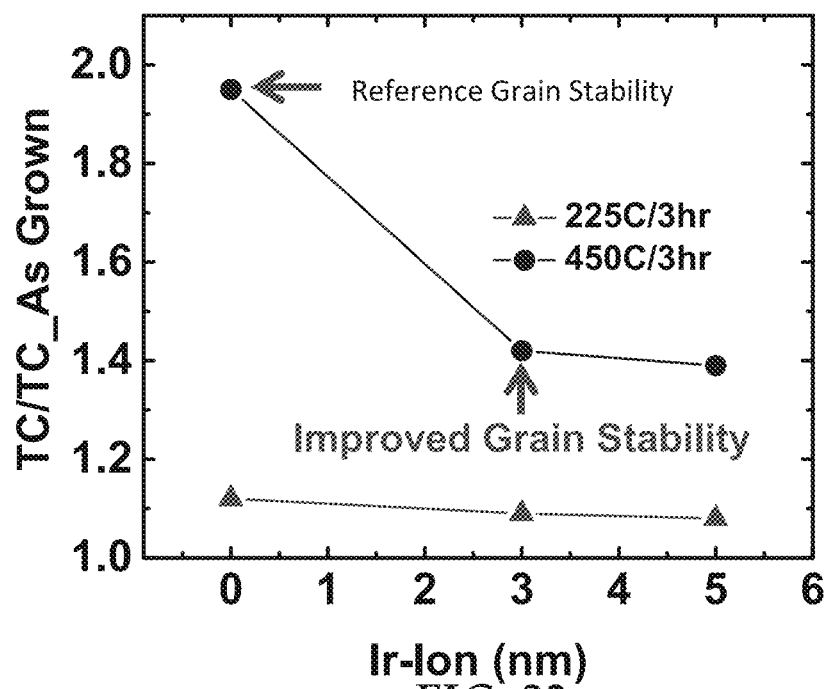

In FIGS. 31 and 32, graphs show the effects of annealing on TC of an Ir layer with no IBE template and template thicknesses of 3 nm and 5 nm. The 3 nm template yields the highest TC of all Ir configs: 51.2 W/mK. Improved grain stability is seen after 450 C anneal.

The above procedures may be used to form any thin-film structure using metals such as Rh and Ir, or other non-metallic crystals that have analogous crystalline microstructures. The approach can be applied to a flat surface or a non-flat surface, e.g. into a trench, onto a step, etc. When used to form an NFT, these metals may also be used with Au, Cu, Al, e.g., for heat sinking, for generating and funneling surface plasmons to a different-material peg, etc. Thus, the processes described above may be extended to include Au, Cu, Al which also has an fcc structure. For example, 2 nm of Au is deposited onto a surface, with IBE removal of 1 nm leaving a 1 nm layer of material. This can be repeated one or more time until a target thickness is reached. The resulting Au structure can be used as a template for forming an Ir or Rh peg using normal deposition (e.g., no intermediate IBE of layers). An Au template can also be used as a temple for forming addition Au, e.g., via deposition without ion beam assistance.

Figure 33:
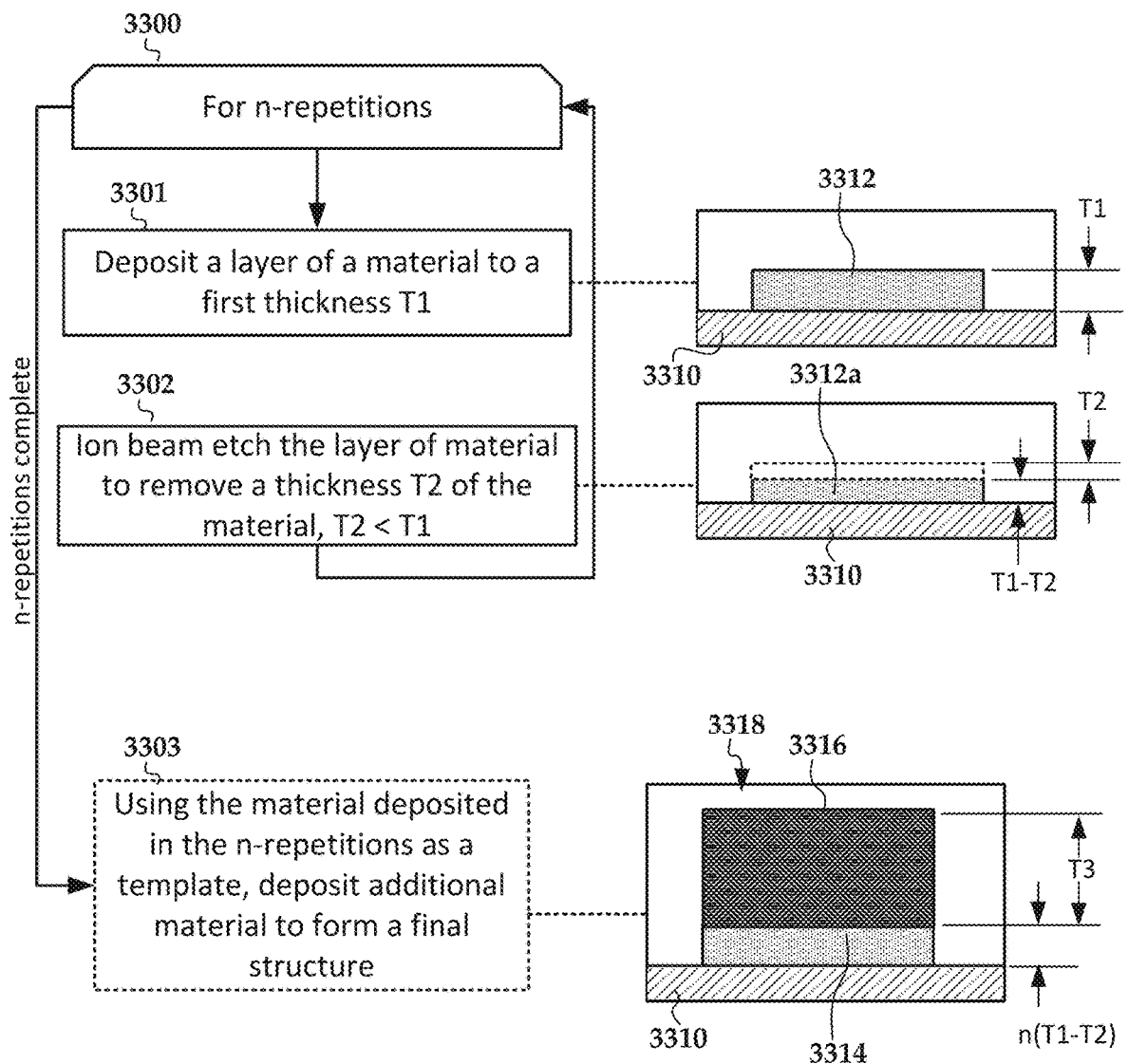
FIG. 33 is a flowchart of a method according to an example embodiment.

In FIG. 33, a flowchart shows a method according to an example embodiment. The method involves performing n-repetitions (n>0) as indicated by loop limit 3300. A layer of a material is deposited to a first thickness T1. The figure shows material 3312 deposited on substrate 3310 to thickness T1. The method further involves ion beam etching the layer of material to remove thickness T2, where T2<T1. This results in part of the material 3312a left with thickness T1-T2, as seen on the right hand side of the figure. It should be noted that values of T1 and T2 may change during subsequent repetitions, as well as the ratio therebetween (T2/T1).

After the repetitions 3300, the resulting structure 3314 of the n-layers will have a total thickness of n(T1-T2) assuming T1 and T2 are constant for all repetitions, otherwise the thickness will be $$\sum_{n}^{k=1} (T1_k - T2_k).$$

The resulting structure 3314 can be used 3303 as a template, upon which are deposited additional material 3316 to form a final structure 3318. The template 3314 and additional material 3318 may be the same or different materials. In the latter case, the materials 3314, 3318 may have the same microstructure, e.g., fcc, bcc, hcp. The final structure 3318 may form an NFT that is deposited on a recording head, the substrate 3310 being part of the recording head or being part of a carrier or sacrificial substrate. In the latter case, the NFT may be transferred to the recording head via flip-chip bonding, transfer printing, etc.

Figure 34:
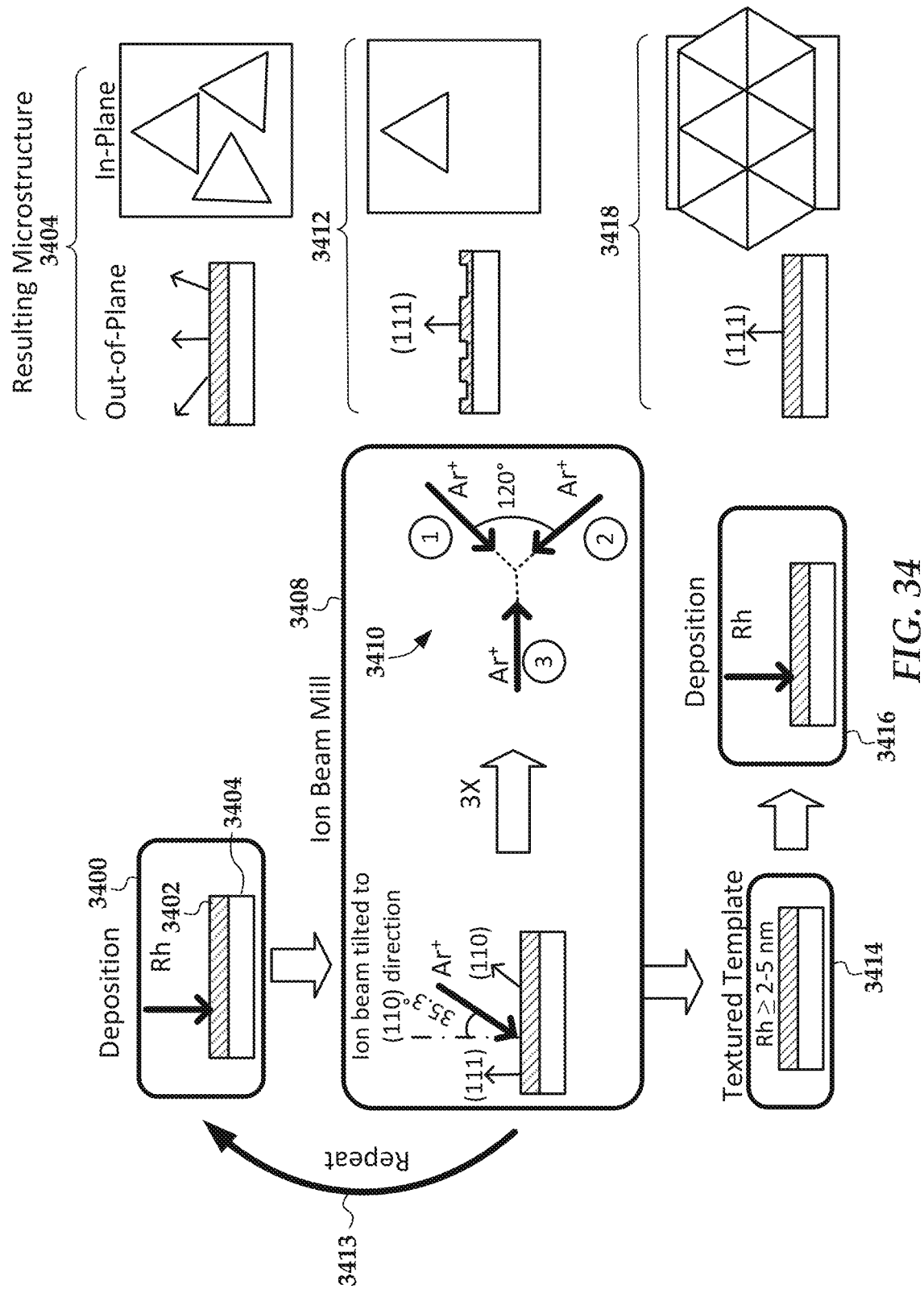
FIG. 34 is a diagram of a method according to another example embodiment.

A milling operation using a perpendicular/normal ion beam angle of incidence can achieve certain orientations, such as orientations normal to the deposition plane. However, perpendicular ion-beam milling may not, by itself, achieve all of the desired NFT crystal orientations, e.g., as shown in FIG. 8. In FIG. 34, a schematic diagram illustrates a manufacturing procedure that may be used to obtain additional predetermined orientations according to example embodiments. The procedure starts with deposition 3400 of a crystalline structure material 3402 (Rh in this case) on a substrate 3404, e.g., an amorphous substrate in this example. As indicated by the microstructure 3406 on the right, regular deposition on an amorphous substrate 3404 has no control on in-plane alignment, resulting in random orientations distribution.

After the initial deposition 3400, an angled ion-beam assisted mill 3408 is performed, in this example with Ar working gas. The angle in this example is 35.3°, which is the relative angle between the {111} vector (perpendicular to deposition plane) and the {110} vector. (see FIG. 3). This results in the highest channeling along the {110} direction. As seen on the right side of block 3408, the 35.3° mill is repeated 3410 three times at different rotation angles relative to an edge of the wafer. These rotation angles (which here are 120° between each repetition of the 35.3° mill) promote three-fold symmetry within the {111} plane, resulting in a subset of the structures remaining intact and in the desired orientation as seen in the resulting microstructure 3412.

As with previous embodiments, the three times ion-beam milling removes a certain thickness after each deposition (e.g., removing 1-2 nm from a 2-3 nm layer). As indicated by arrow 3413, this process is repeated, resulting in net growth per deposition 3404 and mill 3408 cycle of around 1 nm or less. As indicated by block 3414, this repeats until total thickness of the crystalline material reaches a minimum thickness, e.g. 2-5 nm, with proper out-of-plane orientation and in-plane alignment achieved as indicated by microstructure 3418. This structure 3414 can be used as a template for further growth through regular deposition 3416.

Figure 35A:
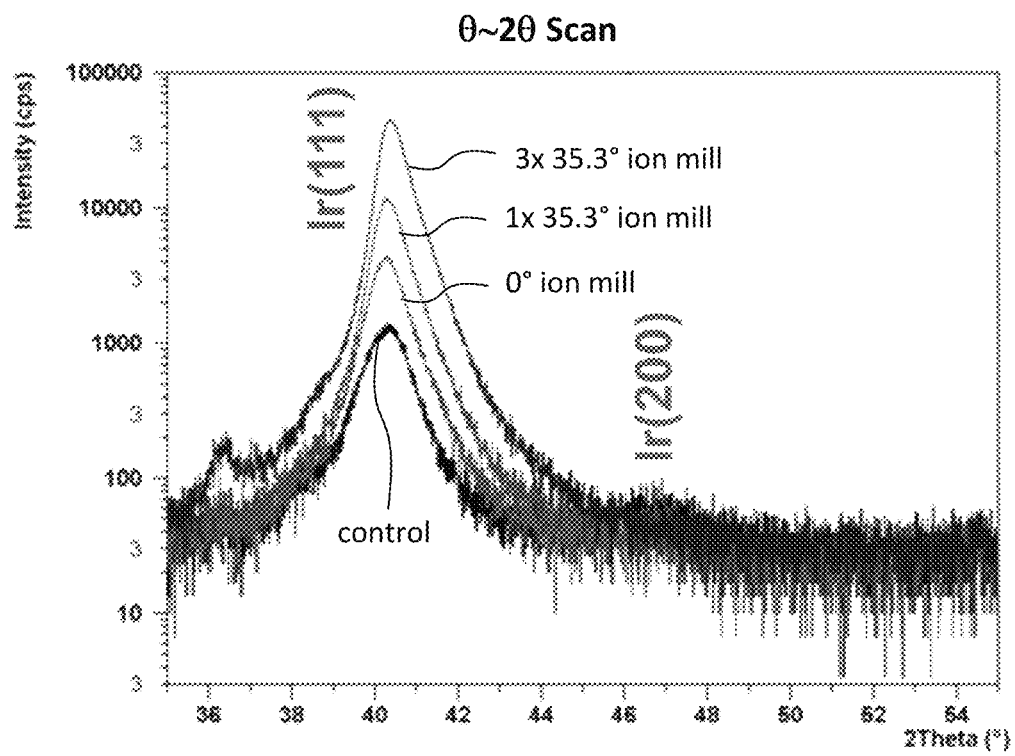
FIGS. 35A-35C are XRD plots showing structures of ion-beam assisted Ir material layers according to example embodiments.
Figure 35B:
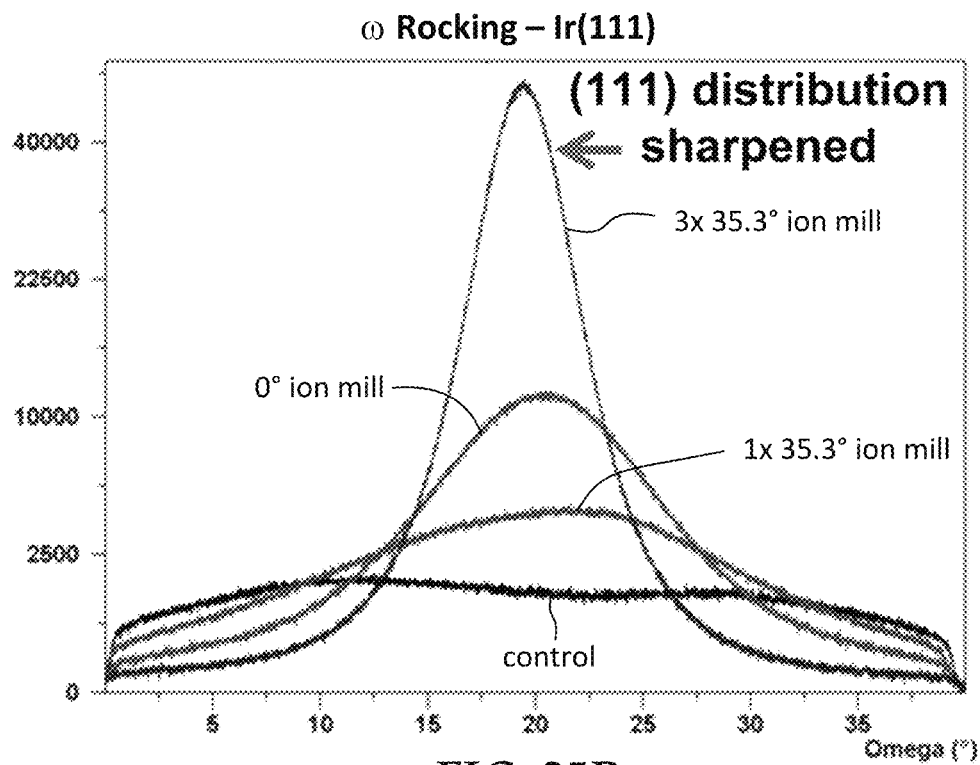
Figures 35C, 36:
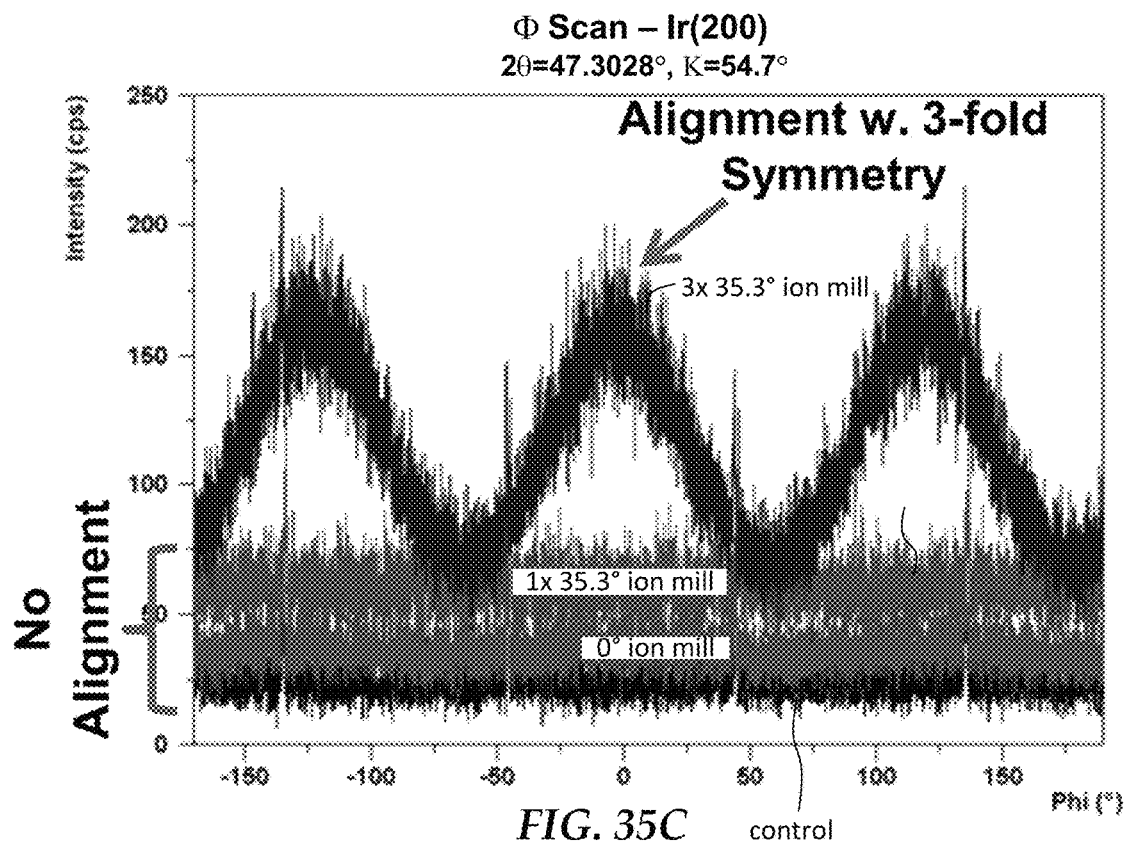
FIG. 36 is a table showing measured characteristics of ion-beam assisted Ir material layers according to example embodiments.

In FIGS. 35A-35C, XRD graphs show the effects of assisted ion mill on deposition processes of Ir structures at elevated temperature (225° C.) according to example embodiments. The table in FIG. 36 summarizes these results of the XRD graphs and also shows measured thermal conductivity of the Ir structures. A control sample was not subjected to ion beam milling, and the other three samples were deposited at a 2 nm depth then 1 nm milled off with Ar at 0° in one case and 35.3° in two other cases. In one 35.3° case, the mill was performed once for each cycle, and for the other the mill was repeated each time at a 1200 offset from the previous angled mill. After this was completed on the milled samples, the resulting structures were used as a template to deposit an additional 40 nm of Ir.

Figure 37:
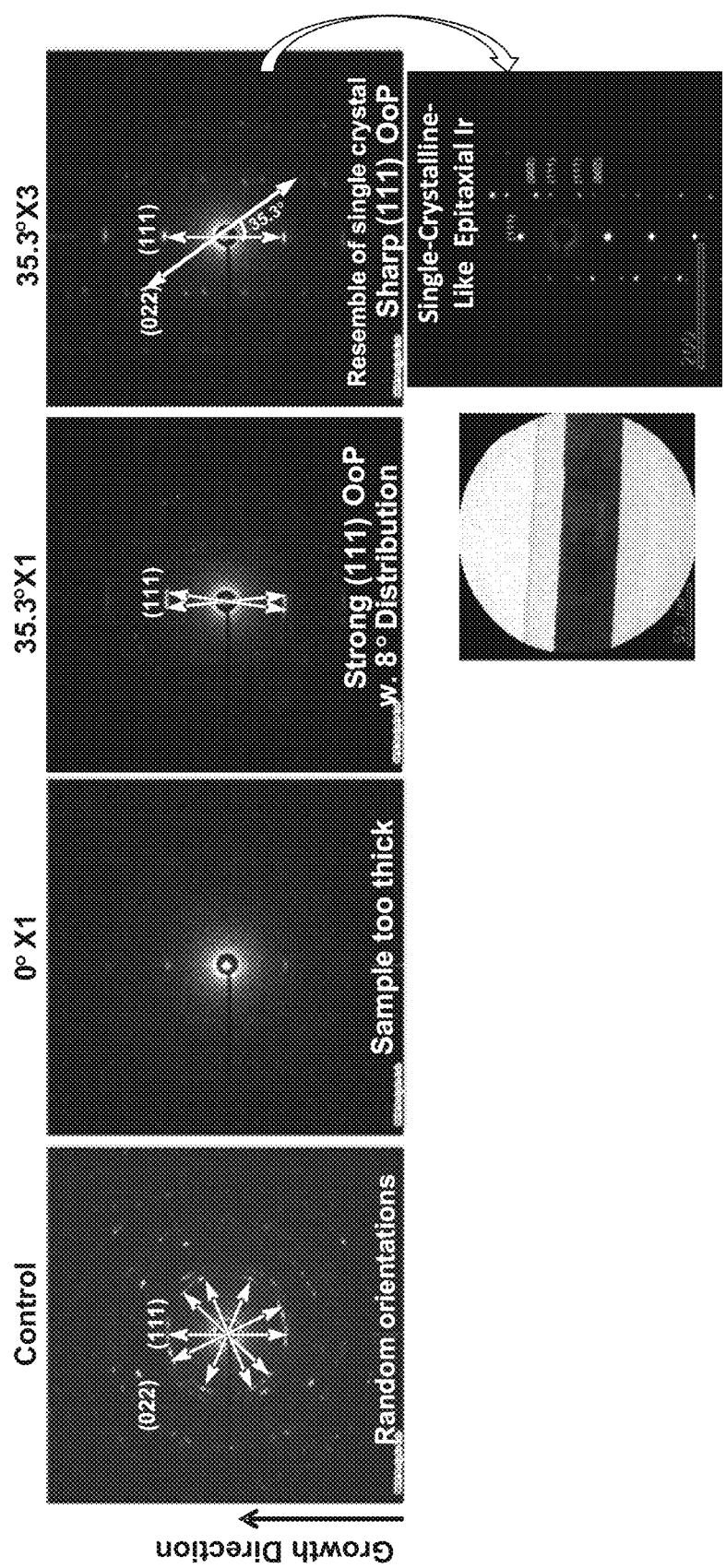
FIG. 37 is a set of transmission electron microscope (TEM) selected area diffraction (SAD) images showing structures of ion-beam assisted Ir material layers according to example embodiments.
Figure 38:
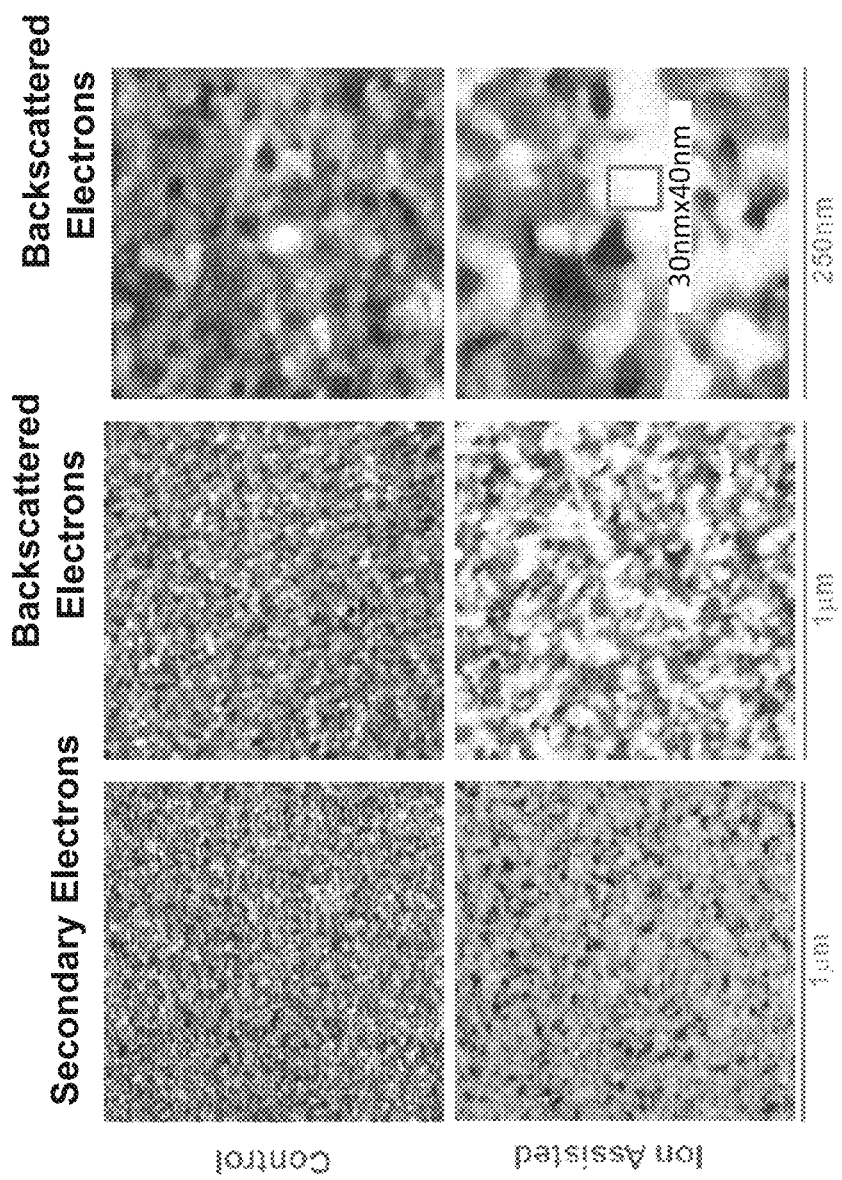
FIG. 38 is a set of scanning electron microscope (SEM) images showing structures of ion-beam assisted Ir material layers according to example embodiments.

As seen in FIGS. 35A-35C, normal incidence (0°) ion beam milling improves out-of-plane texture, but not in-plane texture. Titled incidence (35.3°-{111}-{110}) ion beam with three in-plane repeats not only improves out-of-plane texture, but also promotes in-plane alignment. Further, as seen in FIG. 36, the TC improves by 50% compared to the control. As seen in the TEM SAD and Scanning Electron Microscopy (SEM) images of FIGS. 37 and 38, the best ion assisted condition (35.3° X3) shows a nearly single crystal-like structure with twins about the {111} out of plane direction. The single-crystal-like region is on the order of 200 nm (which is the aperture size of the transmission electron microscope). The control sample shows mostly random grain orientation, with some {111} out-of-plane preference. In FIG. 38, the SEM images taken from same set of samples also show that surface features, e.g., grains, are greatly enlarged with ion beam assistance, such that it is possible to form a single crystalline peg without grain boundaries, as illustrated by the 30 nm×40 nm rectangle drawn in one of the images.

Figure 39:
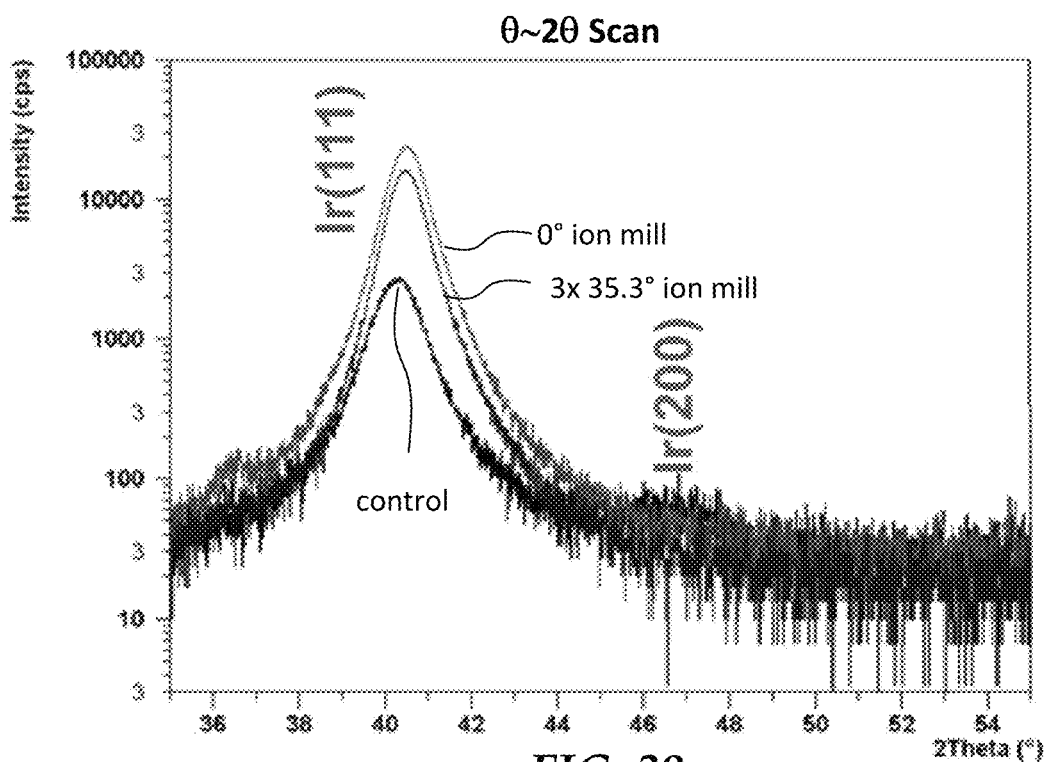
FIGS. 39-41 are XRD plots showing structures of ion-beam assisted Ir material layers according to example embodiments.
Figure 40:
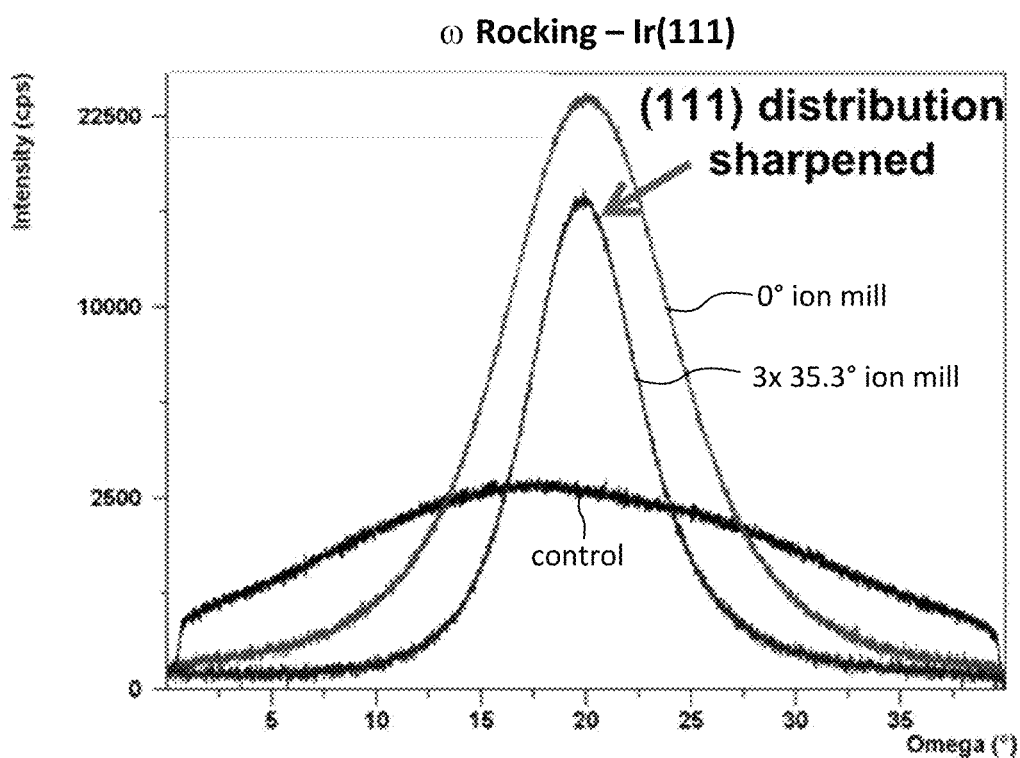
Figures 41, 42:
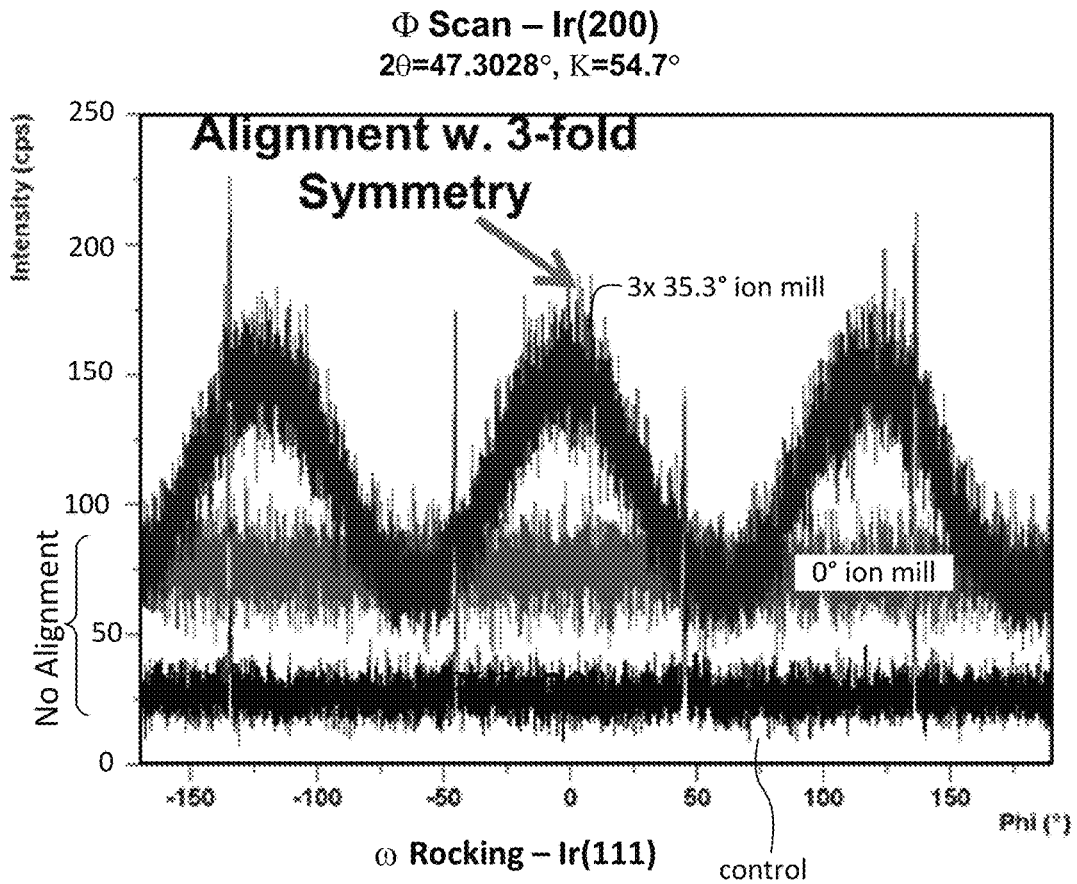
FIG. 42 is a table showing measured characteristics of ion-beam assisted Ir material layers according to example embodiments.

In FIGS. 39-41, XRD graphs show the effects of assisted ion mill on deposition processes of Ir structures at room temperature according to example embodiments. The table in FIG. 42 summarizes the results of the XRD graphs and also shows measured TC of the Ir structures. A control sample was not subjected to ion beam milling, and the other two samples were deposited at a 2 nm depth then 1 nm milled off with Ar at 0° in one case and 35.3° in the other. In the 35.3° case, the mill was performed three times each cycle, each time at a 1200 offset from the others. As with the previous example, normal incidence ion beam improves out-of-plane texture, but not in-plane texture. Titled incidence (35.3°-111-110) ion beam with three in-plane repeats not only improves out-of-plane texture, but also in-plane alignment. Again, TC improved by 40% compared to the control.

Figure 43A:
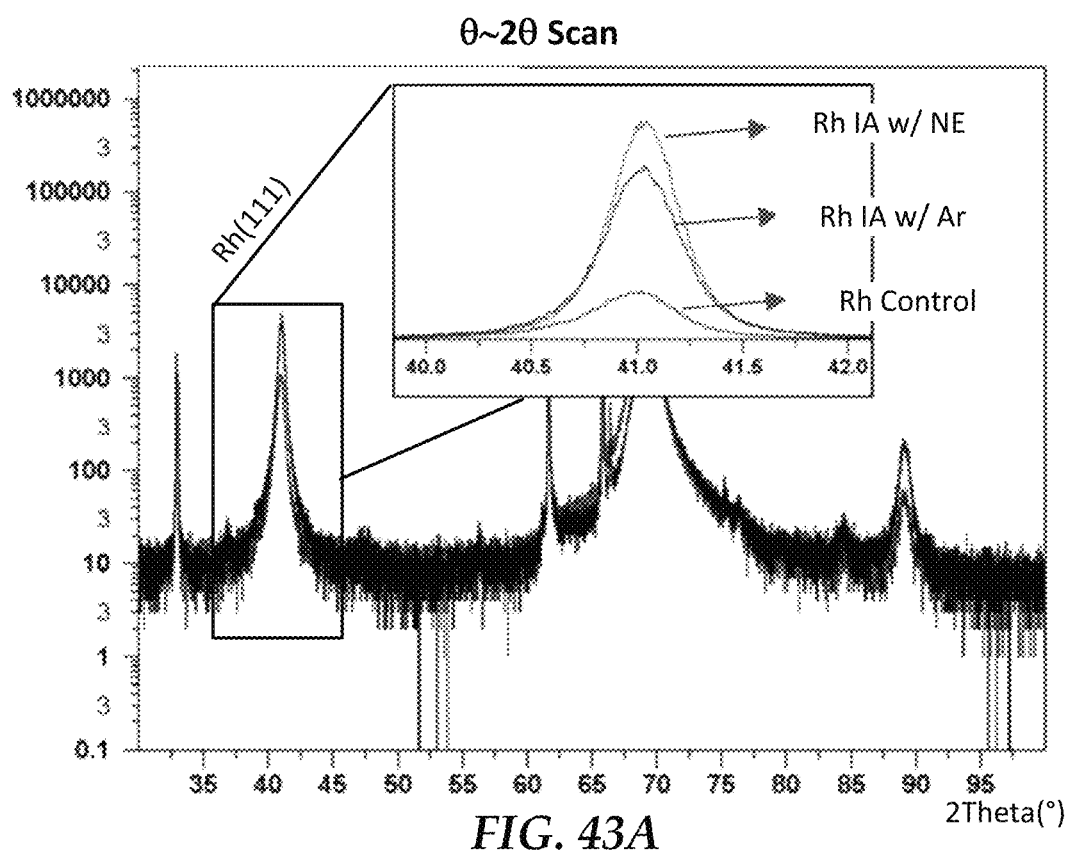
FIGS. 43A-43C are XRD plots showing structures of ion-beam assisted Rh material layers according to example embodiments.
Figure 43B:
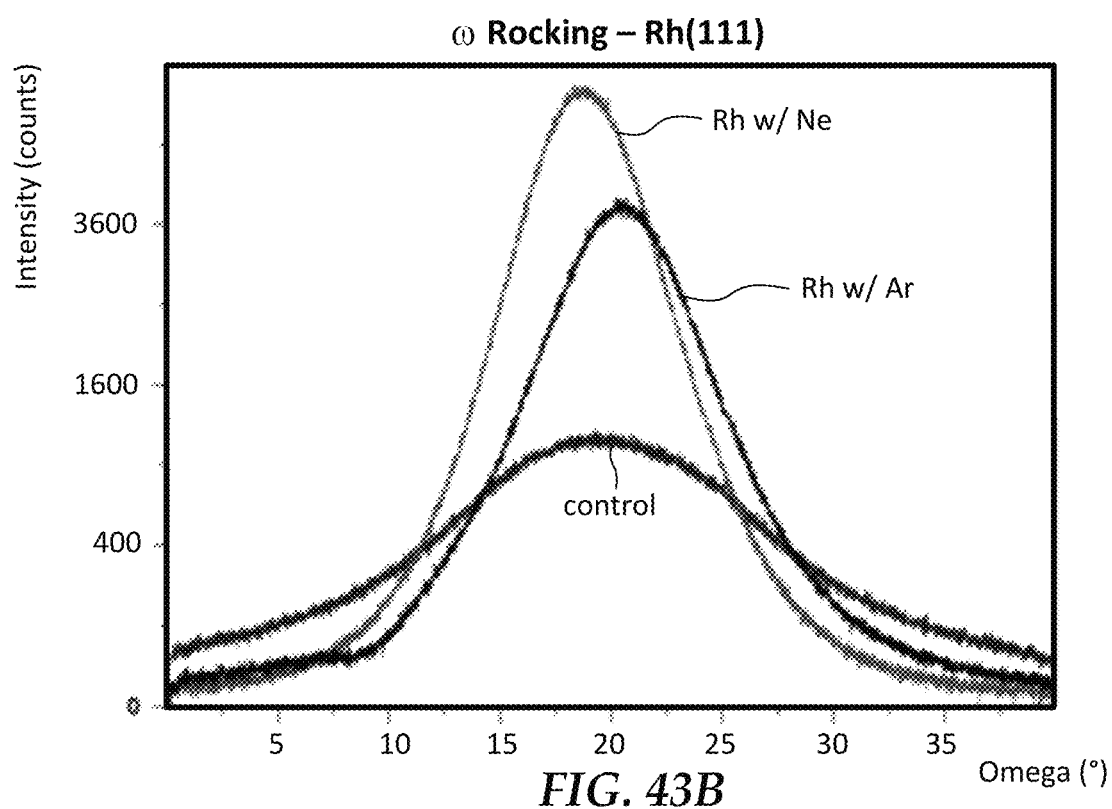
Figures 43C, 44:
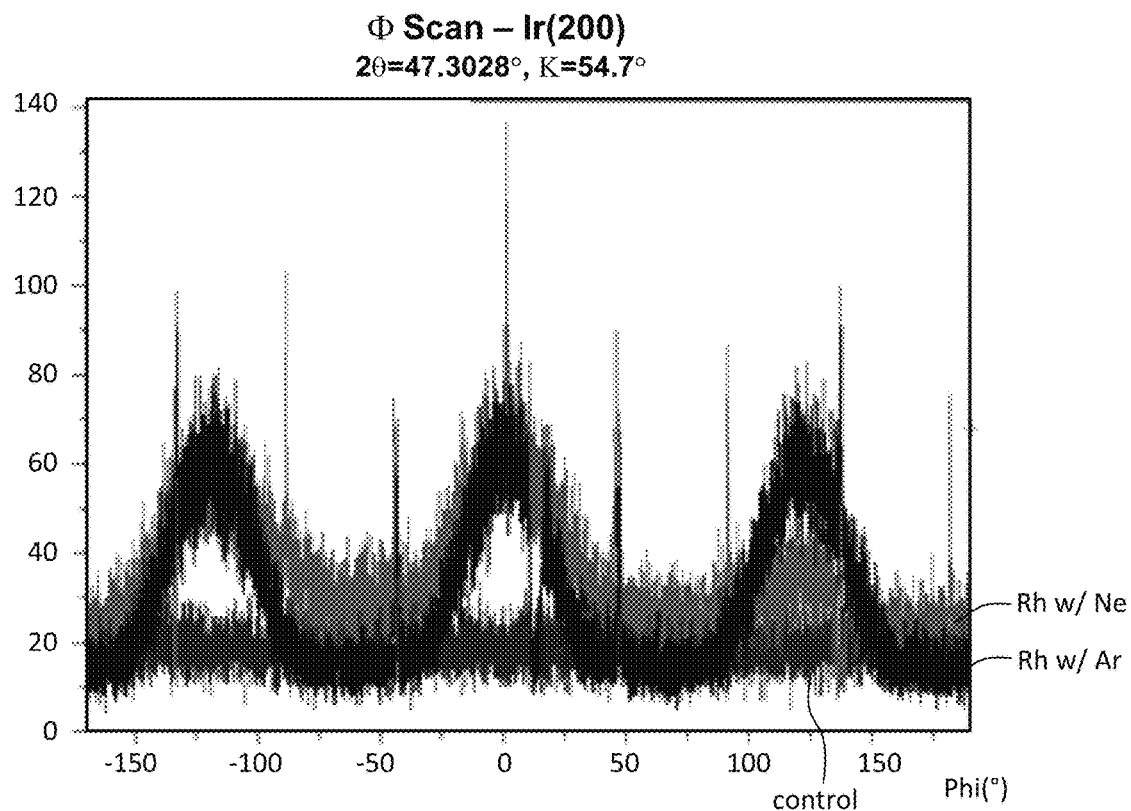
FIG. 44 is a table showing measured characteristics of ion-beam assisted Rh material layers according to example embodiments.
Figure 45:
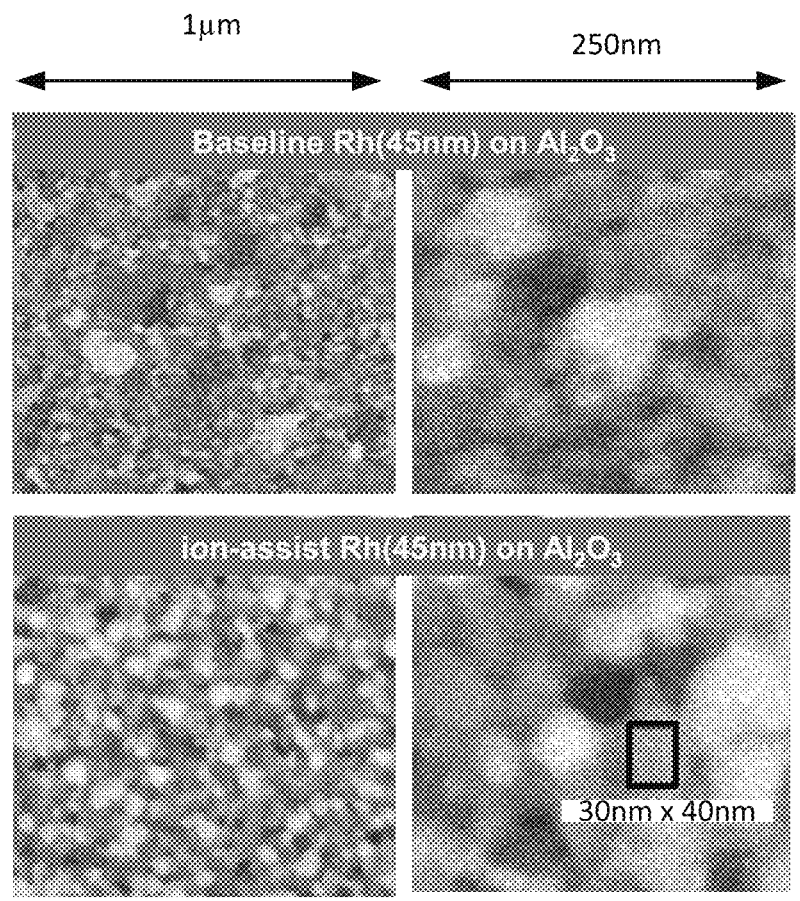
FIGS. 45 and 46 are microscope images showing surface features of a crystalline peg according to an example embodiment.
Figure 46:
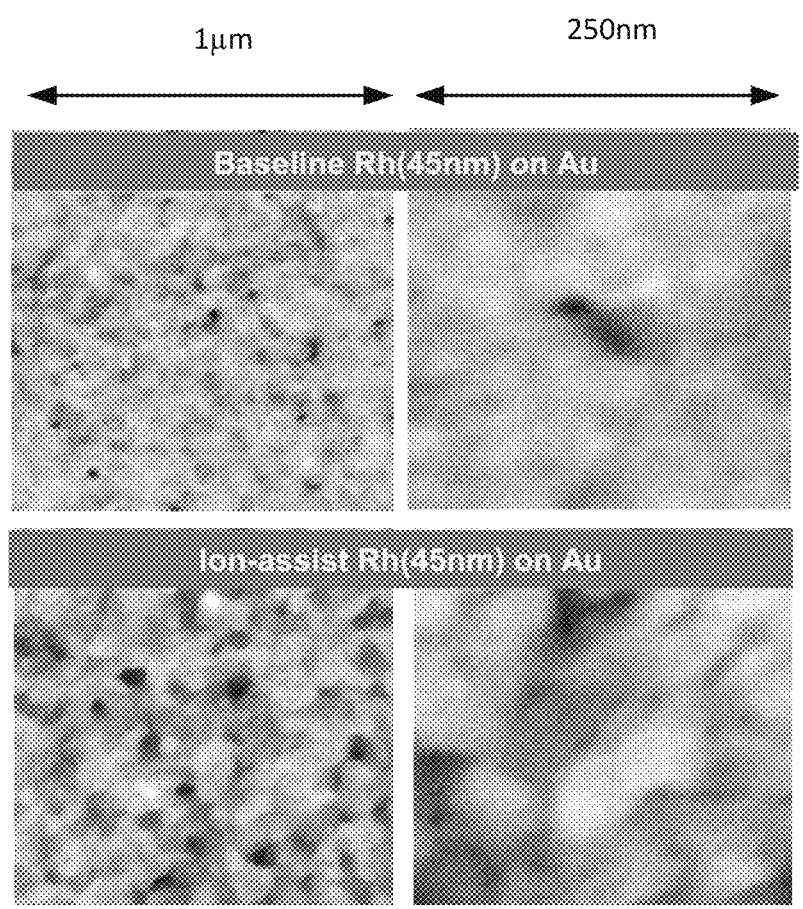

In FIGS. 43A-43C, XRD graphs show the effects of assisted ion mill on deposition processes of Rh structures at elevated temperature (225° C.) with different working gases according to example embodiments. The table in FIG. 44 summarizes the results of these XRD graphs and also shows measure TC of the Rh structures. The particular structure thicknesses and milling processes are also shown in FIG. 44. Compared to the Rh 45 nm control sample, both milled examples show in-plane texture, {111} out-of-plane texture, and crystallinity are improved with the ion-assisted milling processes, with Ne showing slightly better results than Ar. The TC of the Ne milled sample improved nearly 40% compared to the control sample. As seen in FIGS. 45 and 46, microscope imaging also shows grain sizes of the ion-assisted deposited Rh film on both $Al_2O_3$ and Au surfaces, compared to the baseline films.

Figure 47:
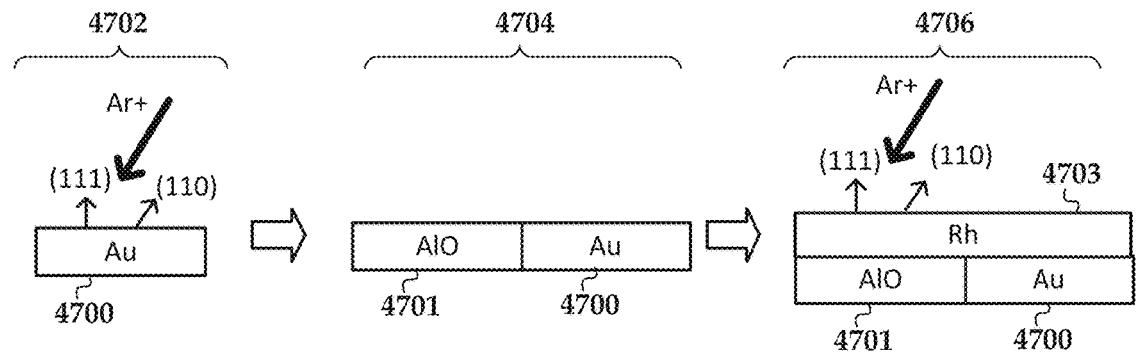
FIG. 47 is a diagram showing processes used to form a near-field transducer according to an example embodiment.

The above embodiments show that crystalline structures with both out-of-plane and in-plane texture using, e.g., Rh or Ir, can be grown on an amorphous layer. Some NFT designs may also have gold portions. For example, an NFT may include a circular-shaped or stadium-shaped Au enlarged portion (also referred to as a disk) that achieves surface plasmon resonance. A peg formed of a more thermally robust material than Au (e.g., Rh, Ir, Pt and Pd, etc) is located on an end of the enlarged part extending towards the recording medium, with shapes and directs surface plasmons to the peg. In FIG. 47, a diagram shows a process used to create a multiple material NFT according to an example embodiment.

An Au disc 4700 may be deposited using a similar process 4702 as described in FIG. 34, e.g., repetitions of deposition, angled milling to form a template, then additional deposition on the template to build the desired thickness. A dielectric material 4701 (e.g., AlO) may be formed over or adjacent to the disk 4704 as indicated in process 4704. Both AlO 4701 and Au 4700 are planarized in preparation for depositing a peg 4703 (e.g Rh) as shown in process 4706. This process 4706 also includes the formation of an angle-milled template of Rh such as shown in FIG. 33.

Figure 48:
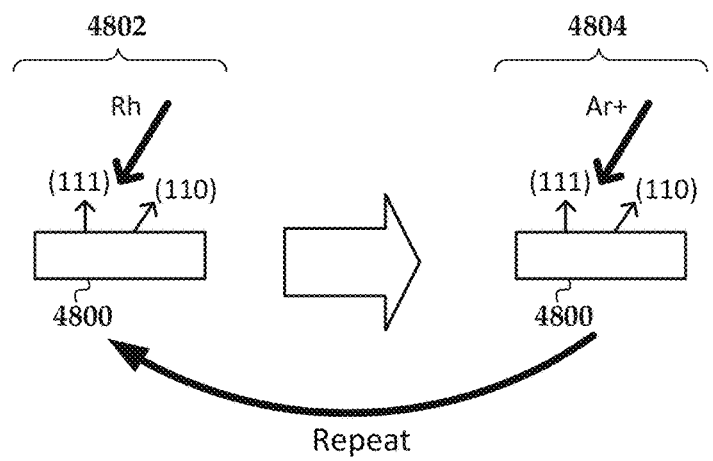
FIGS. 48-50 are diagrams showing process details for forming crystalline structures according to example embodiments.

In the above examples, the improved crystalline structures can be achieved by tilting the wafer at the desired angle, e.g., 35.3° for fcc materials, during ion-beam milling. The placements of the three repeating ion mill rotational angles can be chosen such that crystalline orientations are aligned between Au and Rh, which might promote a more coherent Au/Rh interface for better thermal transport. In FIG. 48, a diagram illustrates deposition and milling process according to another example embodiment. As with previous embodiments, a wafer 4800 is subjected to repeated deposition 4802 and 4804 of a crystalline material, Rh in this example. In this case, the wafer is also tilted at the desired angle (e.g., 35.3° for fcc materials) during deposition 4802. The directional deposition 4802 may include ion-beam deposition, collimated physical vapor deposition, etc., and allows the deposited material to better fill in grains removed by tilted mill 4804, as well as minimizing nano-voids at bottom (first deposited layer).

Figure 49:
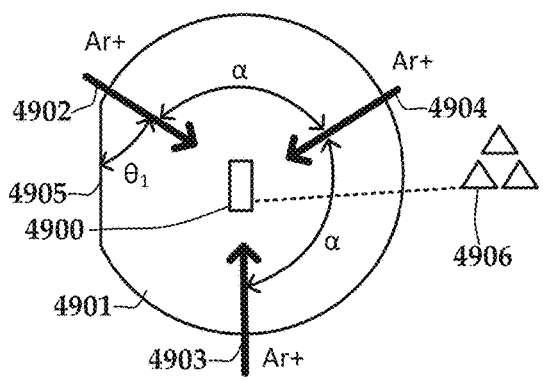
Figure 50:
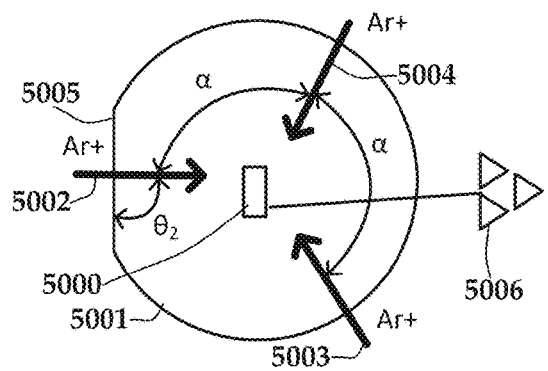

In FIGS. 49 and 50, diagrams show additional details of a process used to achieve a desired, in-plane, crystallographic orientation according to an example embodiment. In FIG. 49, a peg 4900 is formed on a wafer 4901 that is subjected to three different angled milling passes 4902-4904. All of the milling passes 4902-4904 are at the desired channeling angle (e.g., 35.3° for fcc materials) relative to a deposition plane of the wafer 4901. The passes 4902-4904 are at predetermined angles α to one another, e.g., 120°. As indicated by angle $\theta_1$, the milling passes 4902-4904 are at a predetermined angle relative to an edge 4905 of the wafer 4901, which result in the peg 4900 having a first in-plane texture 4906.

In FIG. 50, a peg 5000 is formed on a wafer 5001 similar in orientation to peg 4900 and wafer 4901. In this case, three milling passes 5002-5004 are performed at the desired tunneling angle and relative angles α, but the angle $\theta_2$ relative to the wafer's edge 5005 is different than $\theta_1$, resulting in a different in-plane texture 5006. In this way, crystal orientation of other edges of the peg can be controlled as described in various embodiments above. Note a material deposition process can use a similar orientation of deposition angles θ, α similar to the milling processes shown in FIGS. 49 and 50.

Figure 51:
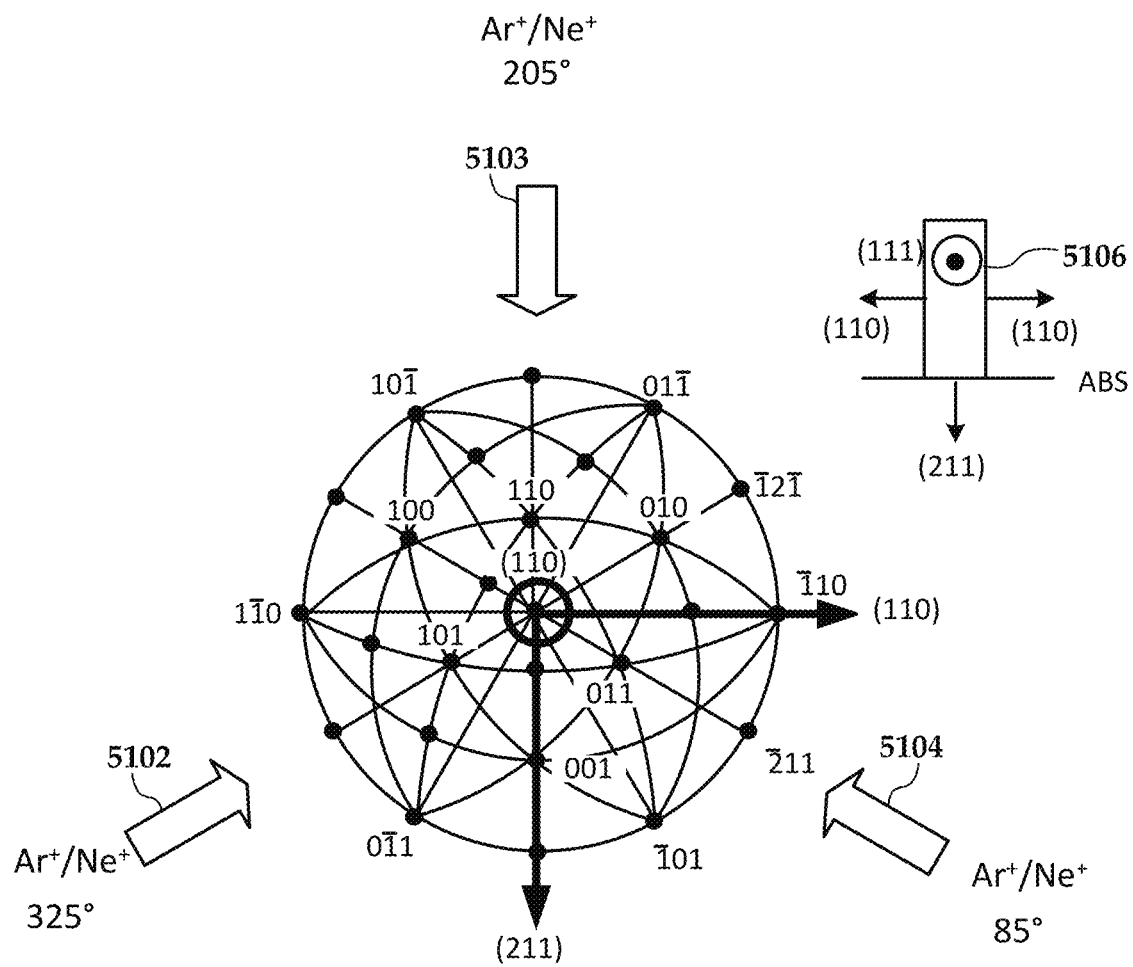
FIGS. 51 and 52 are diagrams showing the manufacturing of different peg variations according to example embodiments.
Figure 52:
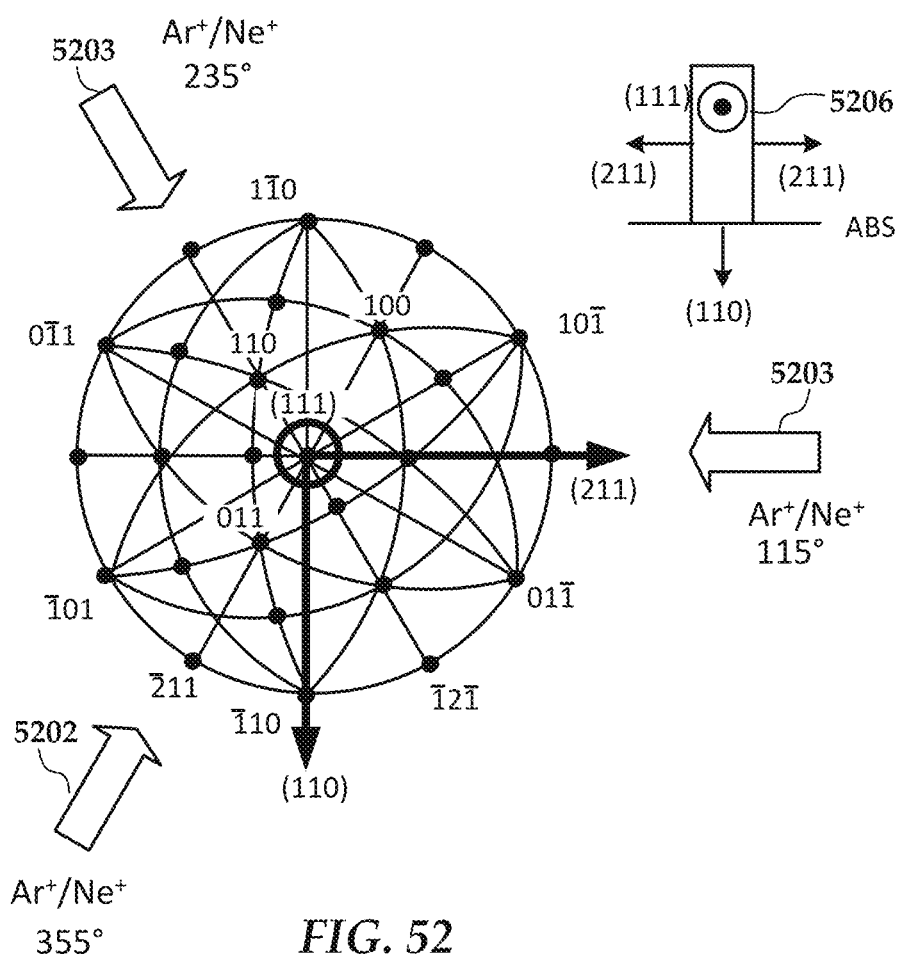

In FIG. 51, a diagram includes a stereographic projection of an fcc crystal to show orientations 5102-5104 of ion-beams used in forming an NFT according to an example embodiment. In this example, an NFT peg 5106 has an edge facing the ABS with {211} orientation, sides with {110} orientations, and top with {111} orientation. This corresponds to configuration 800b shown in FIG. 8. In FIG. 52, a diagram includes a stereographic projection of an fcc crystal to show orientations 5202-5204 of ion-beams used in forming an NFT according to another example embodiment. In this example, an NFT peg 5206 has an edge facing the ABS with {110} orientation, sides with {211} orientations, and top with {111} orientation. This corresponds to configuration 800a shown in FIG. 8.

In summary, ion beam assistance can be used to promote high crystalline-quality metal films with large grain size, and controllable out-of-plane texture and in-plane texture. Ion beam assisted deposition can be used for the entire desired thickness or for a thin layer to serve as a template to guide the bulk layer growth with regular deposition method. The thin template and the bulk layer can be the same material or different materials with similar crystallographic structures. Ion beam incidence is tilted at a certain angle from the normal incidence when removing material. Ways to select the ion beam tilting angle include determining the natural preferred growth direction due to surface energy consideration, e.g. {111} for fcc, {110} for bcc, etc. Based on the preferred growth direction, the easiest ion beam channeling direction is determined, e.g. {110}>{100} for fcc, {111}>{100} for bcc. The tilting angle is set as the angle between two crystalographic planes defined by the growth direction and one of the easy channeling direction, e.g. 35.3° for fcc, which is the angle between {111} and {110}. While a channeling angle is preferred in some embodiments, other angles relative to substrate normal might be used for other considerations, e.g. minimized ion beam damage, etc. The title angle can vary between 0° and 90° relative to substrate normal.

The titled ion beam can be repeated several times relative to wafer surface rotation. The number of repeats depends on the order of symmetry of the crystallographic plane in the growth direction, e.g. 3 repeats with 120° apart for the three-fold symmetry in the {111} growth plane in fcc. A portion of the number of repeats defined by the crystallographic symmetry of the plane in growth direction might be enough to yield the same results as the full number of repeats. For example, one repeat or two repeats with 120° might achieve the same or similar results as three repeats for a fcc material with {111} growth direction. Ion beam assistance can be realized in different ways: simultaneous deposition and ion beam mill, alternates between deposition and ion beam mill, etc. The multiple repeats of ion beam mill to define in-plane texture might be done together with multiple simultaneous ion beams or individually with one ion beam. And the multiple repeats of ion beam mill can be applied after a previous deposition step and before the next deposition step, or they can be applied individually each after a deposition step. Ion beam assisted deposition can be used for the entire film thickness or for a portion to serve as template to guide following growth. Ion beam assisted deposition can be optimized by tuning different parameters, e.g., type of gas, ion beam energy level, mill/deposition ratio, deposition thickness before mill, mill remove thickness, ion assisted template thickness, etc. In-plane orientation arrangements can be engineered by the relative placements of ion beam within wafer rotation. The above approaches can be used for all types of metals, e.g. fcc, bcc, hcp, etc. The above approaches can be applied in any areas of magnetic recording head and media materials fabrication, e.g. HAMR, PMR, reader, etc. The above approach can be applied for any type of crystalline materials, e.g. metals, dielectrics, semiconductors, etc., in any area of applications.

Figure 53:
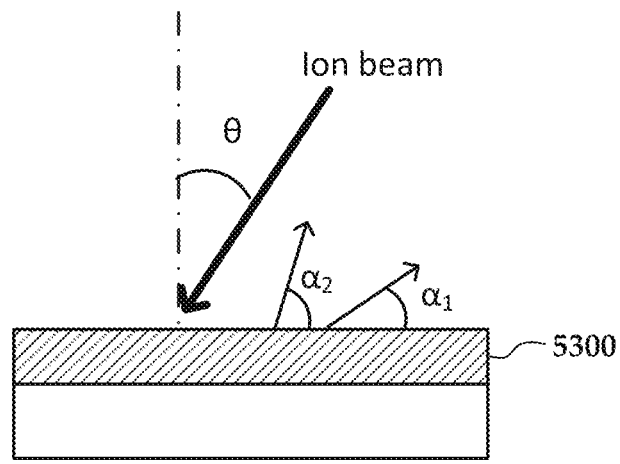
FIGS. 53 and 54 are diagrams showing different ion beam angles used for processing according to an example embodiment.

In FIG. 53, a diagram shows an example of how beam milling angles can be selected for a process according to an example embodiment. Generally, the charged ions are direction at milling angle θ during repeated milling and deposition operations as described above. The material 5300 may have one or more channeling angles, as represented by angles $\alpha_1$ and $\alpha_2$. Depending on the structure of the material (e.g., bcc, fcc, hcp, etc.) and a desired orientation of the manufactured part, milling angle θ may be set to one of $\alpha_1$ and $\alpha_2$. When milling angle θ set at some angle in between two channeling angles, $\alpha_1$ and $\alpha_2$, two sets of textures might be introduced simultaneously with each defined by one of the channeling angles. Setting the milling angle θ to a channeling angles $\alpha_1$ and $\alpha_2$ optimizes the selectivity of the milling, thus is most likely to result in consistency with regards to the desired texture. However, there may be other reasons to change milling angle, and milling angle θ may be between 0 and nearly 90 degrees. In the latter case, there are practical considerations on a maximum value of 0, but it is considered feasible in most installations to have θ>80 degrees.

Figure 54:
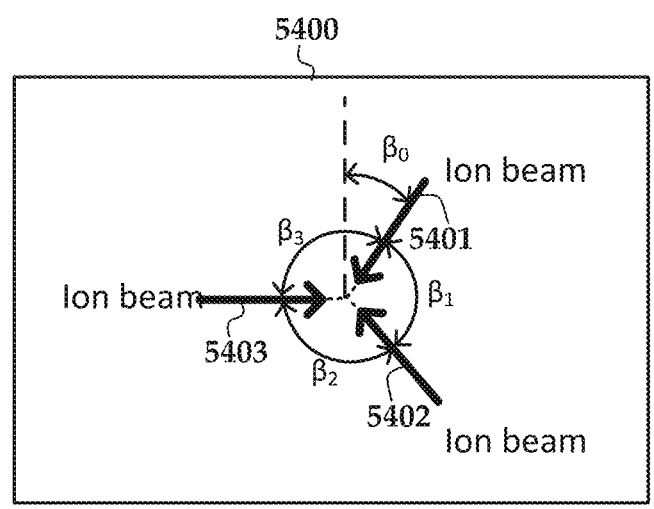

In FIG. 54, a diagram illustrates how beam milling angles can be selected for a process according to an example embodiment. In this angle, in combination with angle θ shown in FIG. 53, the ions beams 5301-5303 are also directed at one or more of angles $\beta_1$-$\beta_3$, with the set of angles $\beta_1$-$\beta_3$ being held relative to a geometric reference of the material wafer 5400, as indicated by angle $\beta_0$. Note that the use of three different angles is for purposes of illustration and not of limitation, more or fewer angles may be used. In some embodiments, the number and placement of ion beams is consistent with in-plane crystallographic symmetry. The beams 5301-5303 may be applied in succession (e.g., at one angle for an amount of time, rotated to another angle and applied for another amount of time, etc.) or simultaneously. The angles shown in FIG. 54 may be varied for a multiplicity of in-plane textures by modifying rotation for different largest-mixed texture, etc. In other cases, a single beam may be applied with a continuous rotation angle. This may result in random in-plane, reinforced out-of-plane texture, etc.

The ion-beam milling angles shown in FIGS. 53 and 54 can be combined with other manufacturing parameters to optimize the process for various materials and target structures. For example, a low divergence ion beam (e.g., <4 degrees) may provide better results. Possible gases to generate ion beam include: H, He, Ne, Ar, Kr, Xe, etc. Using lighter gases, e.g., H, He, Ne, etc., may provide better results. Other factors, such as energy (defined by beam voltage) and flux (controlled by beam current) can be adjusted based on the materials used, the manufacturing equipment used, and desired crystalline structures and orientations. In some cases, it has been found that energy in the range of 50-500 eV provides good results, along with low beam current.

Other variables in the processes described above include the thickness of deposition ($t_{dep}$) and thickness of etching ($t_{etch}$). Generally, $t_{dep}$ of about 2-5 nm provides good results. The deposition to etching thickness ratio $t_{layer}=t_{dep}/t_{etch}$ will be greater than one in order to increase total thickness for each deposit/etch cycle. Having a value of $t_{layer}$ closer to one (e.g., <1.2) will provide better results, but will take more time (e.g., requires, more deposit/etch cycles) to build the desired seed layer thickness (e.g., 2-3 nm).

In some configurations, a manufacturing process involves performing repeated deposition of a crystalline material on a wafer to a first thickness and then ion milling the crystalline material to a second thickness less than the first. The repeated deposition and ion milling resulting in a target crystalline orientation of the crystalline material. The repeated deposition and ion milling can be used as a template for forming a structure having the target crystalline orientation by depositing an additional layer of the crystalline material without ion milling or etching of the additional layer. For example, the structure may include an NFT peg, and/or may be between 10 and 30 nm in thickness.

The process may involve ion milling at a first angle relative to a normal direction of the wafer's surface. The first angle may correspond to a channeling direction of the crystalline material, or may be some other angle, e.g., between zero and 85 degrees relative to the normal direction. The process may involve ion milling at a second angle relative to an edge of the wafer. In this latter case, the process may involve performing one or more milling at the first angle and one or more different values of the second angle. In some cases, the second angle may be varied continuously. In other cases, the second angle may include three angles or a portion of them, e.g. two angles, each separated 120 degrees from the other.

In some cases, the crystalline material may include Rh or Ir. In some cases, the crystalline material may include a bcc, fcc, or hcp material. A working gas used for the ion milling may be Ar or Ne. The repeated deposition and ion milling may involve depositing the crystalline material to a thickness $t_{dep}$ of 2-5 nm, and then ion milling an amount of the crystalline material by $t_{etch}$, where $t_{dep}/t_{etch}<1.2$. In some embodiments, the repeated deposition and ion milling may be performed at room temperature.

Figure 55:
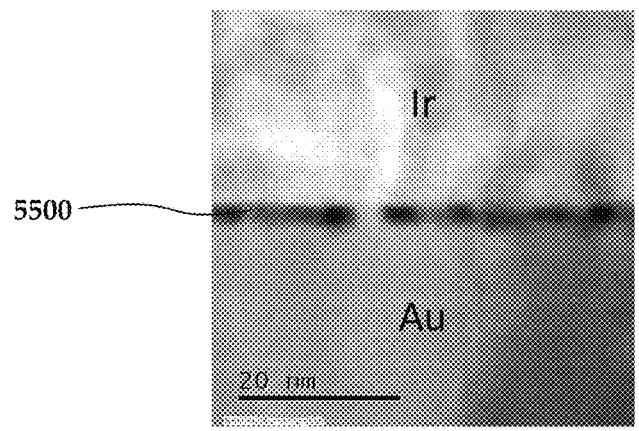
FIG. 55 is a microscope image showing voiding between layers and edge recession using a process according to an example embodiment.

The ion-beam approach described above can be sensitive to factors such as ion beam energy, beam divergence, gas species, and deposition/etch conditions. Further, interface between the base material and the etched material is deposited can be affected by this type of ion-beam milling and deposition process. For example, as seen in FIG. 55, a microscope image shows an Ir structure formed by repetitions of deposition and ion-beam milling formed on top of an Au layer. The region 5500 indicates voiding that was found between the layers.

Figure 56:
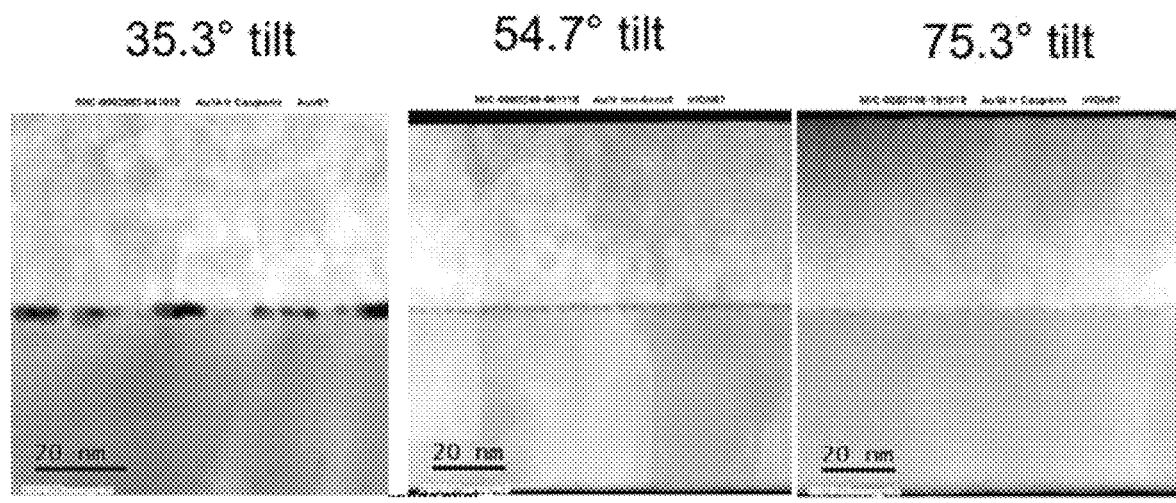
FIG. 56 is a set of microscope images showing the effects on voiding for different tilt angles in a process according to an example embodiment.

Regarding the between-layer voiding, energy-dispersive X-ray spectroscopy (EDS) analysis found that these voids are Ar-enriched, and therefore likely result from Ar used in the etching processes. When Ne was used as the ion beam gas, the interface was improved, however some Ar-enriched voids were seen, likely resulting from Ar plasma used in a neutralizer. It was found that by increasing the milling tilt angle θ (see FIG. 53), there was a corresponding reduction in Ar voids. In FIG. 56, examples show interface Ir—Au interface voiding for three different tilt angles, 35.3°, 54.7°, and 75.3°. The voiding decreases with increasing tilt angle, although in-plane grain texture is best at 35.3°, which is the {110} channeling angle for Ir. Thus, in some situation, a tradeoff may be made between grain texture/TC and interface damage/gas entrapment.

In Table 3 below, a range of tilt angles are shown with deltas from two different channeling angles. One delta is for {110} orientation in the third column and the other delta is for {100}. For best in-plane texture, it is best to have the AO being between ±20°, while maximizing the tilt angle to reduce voiding.

TABLE 3

| Tilt Angle | Main Channeling | Δθ from {110} – 35.3° | Δθ from {110} – 54.7° |
|---|---|---|---|
| 15.3° | {110} | −20° | −40° |
| 25.3° | {110} | −10° | −30° |
| 35.3° | {110} | 0° | −20° |
| 45.3° | {110},{100} | +10° | −10° |
| 50.3° | {100} | +15° | −5° |
| 54.7° | {100} | +20° | 0° |
| 65.3° | {100} | +30° | +10° |
| 75.3° | {100} | +40° | +20° |

Figure 57:
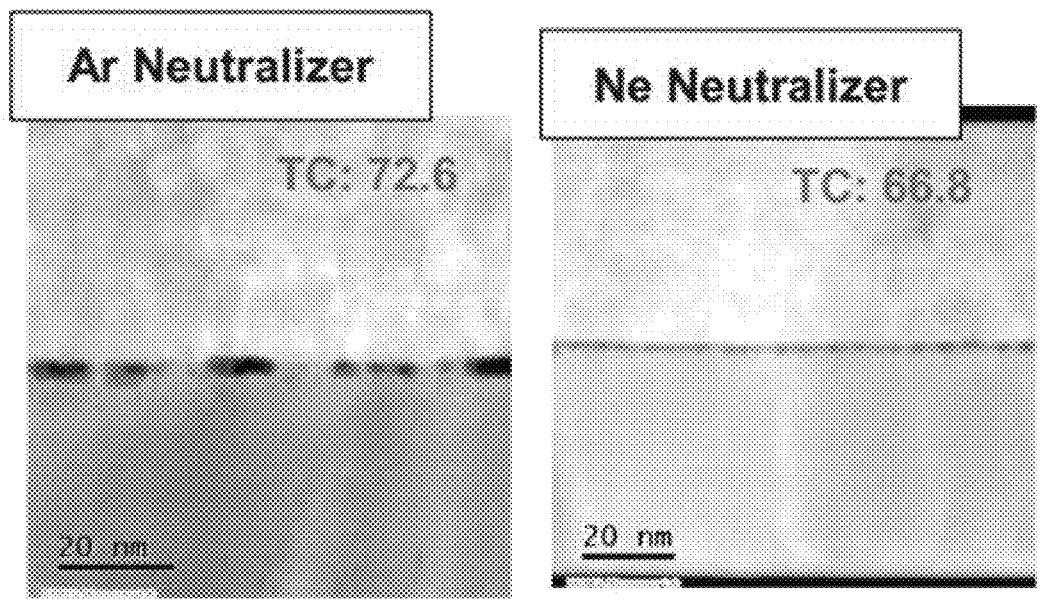
FIG. 57 is a set of microscope images showing the effects on voiding for different neutralizing gases in a process according to an example embodiment.

As noted above, the use of an Ar neutralizer can result in significant voiding at low tilt angles of the ion beam. If the Ar neutralizer is replaced with a Ne neutralizer, this was found to result in less voiding, particularly at low tilt angles. As seen in the images of FIG. 57, there is significantly less voiding when a Ne neutralizer is used at a 35.3° tilt angle. However, the TC with Ar neutralizer is somewhat better. This may due to the Ne neutralizer appearing to result in more complex in-plane texture, and it is expected that Ne gas tuning can be tuned to improve the in-plane texture and TC.

Figure 58:
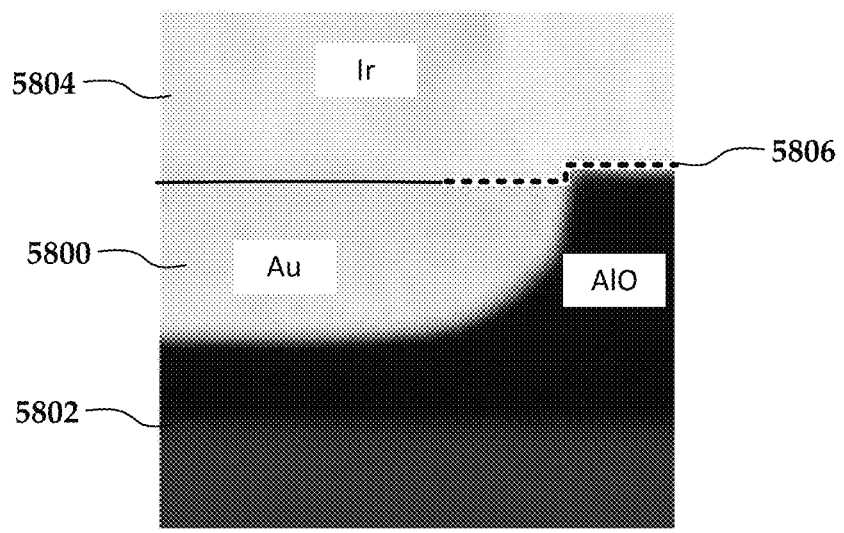
FIG. 58 is a microscope image showing trenching effects affecting a near-field transducer structure according to an example embodiment.

The ion-etching as described herein may also have other effects on the material layers upon which the Ir or Rh structures are built. An example of this is seen in the microscope image of FIG. 58. An Ir layer 5804 is deposited upon an Au structure 5800, which itself is built on an AlO substrate 5802. The top edge of the Au structure 5800 and the AlO 5802 are preferably flush on the right hand side, but there is a recession or trench in the Au as indicated by the dashed line 5806.

Due to the setting of the ion beam angle, Au is more prone to the mill during the deposition/milling operations that are used to form the Ir 5804. Thus the film left is thinner at the edge of the Au 5800 than the AlO 5802 in region 5806. This can be a problem for some structures. For example, certain NFT features will exhibit reduced performance (e.g., optical efficiency, susceptibility to wear) if the Au (or similar material) is out of design tolerance. These effects can be mitigated by careful selection of the rotation angles, such as angles $\beta_1$-$\beta_3$ shown in FIG. 54.

Figure 59:
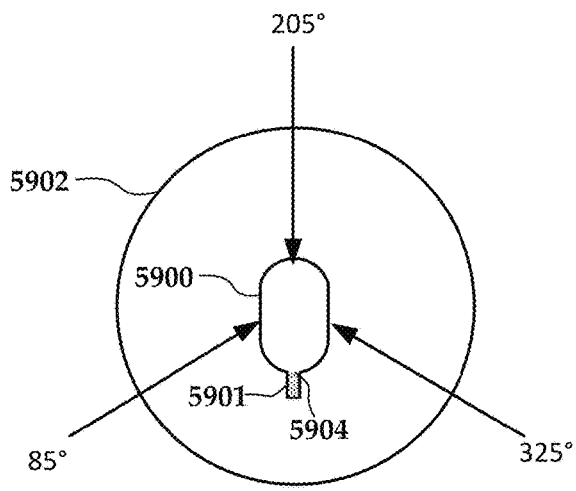
FIGS. 59 and 60 are diagrams showing various rotation angles for milling a near-field transducer according to an example embodiment.
Figure 60:
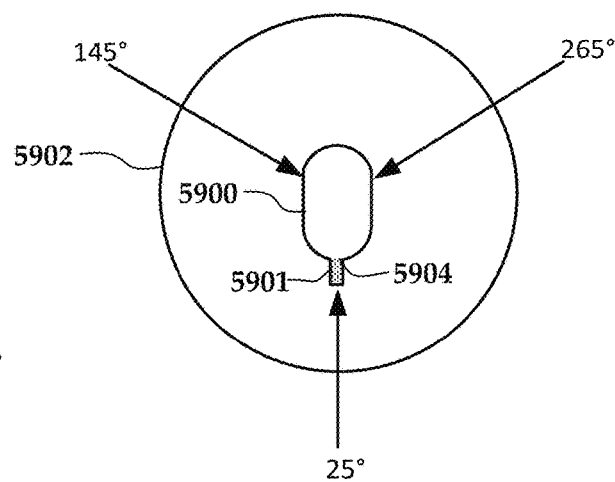
Figure 61:
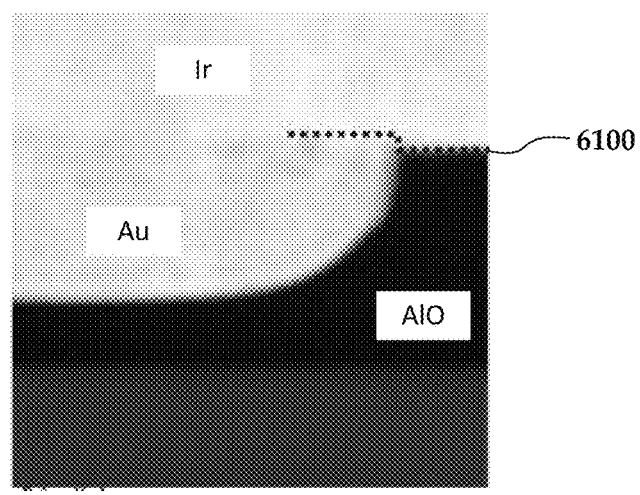
FIG. 61 is a microscope image showing the effect of a different milling rotation angle on trenching according to an example embodiment.

For example, in FIG. 59, a diagram schematically indicates ion beam rotation angles according to an example embodiment. An Au disc 5900 and Ir or Rh peg 5901 are oriented relative to a wafer 5902, with the ion beam being rotated during milling by the three indicated angles when forming the peg. As a result of this, a region 5904 of the disc 5900 may become trenched. As shown in FIG. 60, the ion beams are rotated by 180°, so the AlO surface of the wafer 5902 is closer to the direct ion beam. In FIG. 61, a microscope image shows that a 180° rotation results in the AlO trenching instead of the Au. As AlO mill rate is slower than Au, the trenching effect at this angle is expected to be less severe and negative effects can be more easily controlled.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A thin film near-field transducer, comprising:
   a plurality of crystalline grains of a metal;
   a first surface parallel to a substrate on which the near-field transducer is deposited, a first majority of the crystalline grains at the first surface being oriented at a first plane orientation to have a first atomic packing factor at the first surface; and
   a second surface orthogonal to the first surface and parallel to an air bearing surface, a second majority of the crystalline grains at the second surface oriented at a second plane orientation to have a second atomic packing factor, wherein an average of the first and second atomic packing factors is greater than or equal to 0.70.

2. The thin film near-field transducer of claim 1, wherein the average of the first and second atomic packing factors comprises the first and second atomic packing factors being weighted by respective first and second areas of the first and second surfaces.

3. The thin film near-field transducer of claim 1, wherein the metal comprises an fcc structure.

4. The thin film near-field transducer of claim 1, wherein the first surface has a {111} plane orientation and the second surface has a {211} plane orientation.

5. The thin film near-field transducer of claim 1, wherein the thin film near-field transducer comprises one of Ir or Rh.

6. The thin film near-field transducer of claim 1, wherein the thin film near-field transducer comprises:
   an ion beam milled template that has the first and second atomic packing factors on the first and second surfaces; and
   a thicker layer of second material formed on the template without ion beam milling.

7. The thin film near-field transducer of claim 6, wherein the first and second material are the same.

8. The thin film near-field transducer of claim 6, wherein the first and second materials are different but have a same microstructure.

9. A recording head, comprising the substrate and the thin film near-field transducer of claim 1.

10. The thin film near-field transducer of claim 1, further comprising a third surface orthogonal to both the first surface and the second surface, the third surface having a third atomic packing factor, wherein a second average of the first, second, and third atomic packing factors is greater than or equal to 0.70.

11. The thin film near-field transducer of claim 10, wherein the second average of the first, second, and third atomic packing factors comprises the first, and second, and third atomic packing factors being weighted by respective first, second, and third areas of the first, second, and third surfaces.

12. The thin film near-field transducer of claim 11, further comprising:
   a fourth surface parallel to the second surface and having the second atomic packing factor; and
   a fifth surface parallel to the third surface and having the third atomic packing factor, wherein a third average of the first, second, and third atomic packing factors is weighted by the respective areas of the first, second, third, fourth and fifth surfaces, the third average being greater than or equal to 0.70.

13. A thin film near-field transducer, comprising:
   a plurality of crystalline grains of Rh or Ir;
   a first surface parallel to a substrate on which the thin film structure is deposited, a first majority of crystalline grains at the first surface having a first plane orientation such that the first surface has a first surface energy; and
   a second surface orthogonal to the first surface and parallel to an air bearing surface, a second majority of crystalline grains at the second surface second having a second plane orientation such that the second surface has a second surface energy, an average of the first and second surface energies being less than or equal to $3.5 \times 10^{-4}$ ergs for Rh or less than or equal to $3.7 \times 10^{-4}$ ergs for Ir.

14. The thin film near-field transducer of claim 13, wherein the crystalline grains comprise Rh, the first plane orientation is {111}, and the second plane orientation is {011}.

15. The thin film near-field transducer of claim 13, wherein the crystalline grains comprise Rh, the first plane orientation is {111}, and the second plane orientation is {211}.

16. The thin film near-field transducer of claim 13, wherein the thin film near-field transducer comprises:

an ion beam milled template that has the first and second plane orientations; and a thicker layer of second material formed on the template without ion beam milling.

17. A recording head comprising the substrate and the thin film near-field transducer of claim 13.

18. A thin film near-field transducer, comprising:

a plurality of crystalline grains of an fcc metal;

a first surface parallel to a substrate on which the near-field transducer is deposited, a first majority of the crystalline grains at a first plane orientation; and a second surface orthogonal to the first surface and parallel to an air bearing surface, a second majority of the crystalline grains at a second plane orientation, wherein the respective first and second plane orientations are one of: {100},{100}; {100},{210}, {211},{111}; {110},{111}; {111},{211}; {111},{100}; {110},{211}; or {211},{110}.

19. A recording head comprising the substrate and the thin film near-field transducer of claim 18.

* * * * *